US008686738B2

(12) United States Patent
Sexton et al.

(10) Patent No.: US 8,686,738 B2
(45) Date of Patent: Apr. 1, 2014

(54) ELECTRICAL SAFETY DEVICES AND SYSTEMS FOR USE WITH ELECTRICAL WIRING, AND METHODS FOR USING SAME

(75) Inventors: Robert Jay Sexton, Hendersonville, TN (US); Fred Lane Martin, Carrollton, GA (US)

(73) Assignee: Newire, Inc., Knoxville, TN (US)

( * ) Notice: Subject to any disclaimer, the term of this patent is extended or adjusted under 35 U.S.C. 154(b) by 414 days.

(21) Appl. No.: 12/952,524

(22) Filed: Nov. 23, 2010

(65) Prior Publication Data

US 2011/0063768 A1  Mar. 17, 2011

Related U.S. Application Data

(63) Continuation-in-part of application No. 12/398,660, filed on Mar. 5, 2009, now Pat. No. 8,228,071, which is a continuation-in-part of application No. 11/782,450, filed on Jul. 24, 2007, now Pat. No. 7,915,899.

(60) Provisional application No. 60/820,197, filed on Jul. 24, 2006, provisional application No. 61/034,002, filed on Mar. 5, 2008.

(51) Int. Cl.
*G01R 31/02* (2006.01)
*H02H 3/00* (2006.01)

(52) U.S. Cl.
USPC ............................................. 324/539; 361/79

(58) Field of Classification Search
USPC ............................................. 324/539; 361/79
See application file for complete search history.

(56) References Cited

U.S. PATENT DOCUMENTS

| 4,196,378 | A |   | 4/1980 | Shirai |
|---|---|---|---|---|
| 4,519,133 | A |   | 5/1985 | Pansanel |
| 4,927,384 | A |   | 5/1990 | Bates |
| 5,185,580 | A |   | 2/1993 | Nichols et al. |
| 5,228,072 | A |   | 7/1993 | Ingalsbe et al. |
| 5,570,029 | A |   | 10/1996 | Bottman et al. |
| 5,600,524 | A |   | 2/1997 | Neiger et al. |
| 5,804,768 | A |   | 9/1998 | Sexton et al. |
| 5,856,711 | A | * | 1/1999 | Kato et al. .................. 307/10.6 |
| 5,896,260 | A | * | 4/1999 | Esposito ......................... 361/79 |

(Continued)

OTHER PUBLICATIONS

Written Opinion of the International Search Report of PCT/US2007/074247.

(Continued)

*Primary Examiner* — Jeff Natalini
(74) *Attorney, Agent, or Firm* — McGinn IP Law Group, PLLC

(57) ABSTRACT

Disclosed are systems and methods for monitoring an electrical wire. A safety device utilized to monitor the wire may include at least one current sensing device, at least one voltage sensing device, and at least one processing component. The current sensing device measures a current on at least one conductor of the wire. The voltage sensing device measures a voltage associated with the safety device. The at least one processing component receives the measurements and identifies, based upon the current measurement, an overcurrent event. The processing component then compares the voltage measurement to a stored voltage value and determines, based upon the comparison, that a difference between the voltage measurement and the stored voltage value satisfies a threshold condition. The processing component directs, based upon the determination, at least one relay to be opened to discontinue provision of an electrical power signal onto the electrical wire.

27 Claims, 17 Drawing Sheets

(56) References Cited

U.S. PATENT DOCUMENTS

| | | | |
|---|---|---|---|
| 6,026,145 A | 2/2000 | Bauer et al. | |
| 6,107,577 A | 8/2000 | Sexton et al. | |
| 6,121,886 A * | 9/2000 | Andersen | 340/635 |
| 6,147,498 A * | 11/2000 | Sumiya et al. | 324/415 |
| 6,195,243 B1 * | 2/2001 | Spencer et al. | 361/64 |
| 6,232,556 B1 | 5/2001 | Daugherty et al. | |
| 6,344,748 B1 | 2/2002 | Gannon | |
| 6,492,595 B2 | 12/2002 | Sexton et al. | |
| 6,697,238 B2 | 2/2004 | Bonilla et al. | |
| 6,774,741 B2 | 8/2004 | McCurdy et al. | |
| 6,833,713 B2 | 12/2004 | Schoepf et al. | |
| 6,856,137 B2 | 2/2005 | Roden et al. | |
| 6,922,060 B1 | 7/2005 | Wendel et al. | |
| 6,930,490 B2 | 8/2005 | Saunders et al. | |
| 6,980,407 B2 * | 12/2005 | Kawate et al. | 361/42 |
| 7,030,621 B2 | 4/2006 | Sarkozi et al. | |
| 7,253,636 B2 | 8/2007 | Shambaugh, Jr. et al. | |
| 7,906,973 B1 | 3/2011 | Orr | |
| 7,915,899 B2 | 3/2011 | Sexton et al. | |
| 8,228,071 B2 | 7/2012 | Sexton et al. | |
| 8,278,938 B2 | 10/2012 | Sexton et al. | |
| 2002/0196032 A1 * | 12/2002 | Hughes | 324/539 |
| 2004/0207407 A1 | 10/2004 | Shander | |
| 2005/0237680 A1 * | 10/2005 | Egner | 361/42 |
| 2013/0182361 A1 | 7/2013 | Sexton et al. | |

OTHER PUBLICATIONS

T. Venkateswara Reddy, Mathematical morphology for discrimination between internal faults and inrush currents in power transformers, J. Electrical Systems 4.1. Feb. 29, 2008, pp. 24-35, Department of Electrical Engineering, National Institute of Technology, Calicut, Kerala, 673601, India.

Michael R. Yenchek, Distinguishing Motor Starts from Short Circuits Through Phase-Angle Measurements, Mar. 1, 1997, United States Department of the Interior.

* cited by examiner

ELECTRICAL SAFETY DEVICES AND SYSTEMS FOR USE WITH ELECTRICAL WIRING, AND METHODS FOR USING SAME

CROSS REFERENCE TO RELATED APPLICATIONS

This application is a continuation-in-part of U.S. patent application Ser. No. 12/398,660, filed Mar. 5, 2009, entitled ELECTRICAL SAFETY DEVICES AND SYSTEMS FOR USE WITH ELECTRICAL WIRE, AND METHODS FOR USING SAME, which is a continuation-in part of co-pending U.S. patent application Ser. No. 11/782,450, filed Jul. 24, 2007, entitled ELECTRICAL SAFETY DEVICES AND SYSTEMS FOR USE WITH ELECTRICAL WIRING, AND METHODS FOR USING SAME, which claims priority to U.S. Provisional Application No. 60/820,197, entitled ACTIVE SAFETY DEVICES, which was filed on Jul. 24, 2006. Additionally, U.S. patent application Ser. No. 12/398, 660 claims priority to U.S. Provisional Application No. 61/034,002, filed Mar. 5, 2008, entitled ACTIVE SAFETY DEVICES AND METHODS FOR USE WITH ELECTRICAL WIRE. The disclosures for each or these applications are incorporated herein by reference in their entirety.

FIELD OF THE INVENTION

Embodiments of the invention generally relate to safety devices and systems used in conjunction with electrical wiring.

BACKGROUND

Most homes and commercial buildings utilize electrical wiring systems to distribute power throughout the structure. Typically, electrical wiring systems carry a 120 or 240 volt signal at 15 or 30 amps, respectively, to provide electrical power for lighting systems, climate control systems, appliances, and other electrical loads. Many accidents occur annually due to penetrations of electrical wires or due to deterioration of older wiring systems.

According to reports issued by the Consumer Products Safety Commission (CPSC) in 1997, home wire systems caused over 40,000 fires that resulted in 250 deaths and over $670 million of property damage. Further study by the CPSC based on 40,300 electrical circuit fires showed that 36% were due to installed wiring and 16% were due to cord/plugs.

Today, circuit breakers primarily protect against certain overload and short circuit conditions which occur primarily in fixed wiring. The overload protection is provided by the slow heating of a bimetal strip that breaks the circuit causing the breaker to trip after a specified period of time. Additionally, the lower limit of the magnetic trip setting may be determined by the manufacturer such that the device does not nuisance trip on high inrush loads. Accordingly, in order to avoid false trips, the tripping of a circuit breaker based on a wide variety of wire faults present on a connected electrical wire may be a relatively slow event. This relatively slow tripping may lead to property damage and/or personal injury.

Circuit breakers do not protect against all hazards that may occur within electrical wiring systems. For example, circuit breakers are not effective in detecting arc faults. Therefore, in addition to circuit breakers, there are many other safety devices that have been designed for use with electrical wiring. One such safety device that is commonly installed in electrical wiring systems is a Ground Fault Circuit Interrupter (GFCI). A GFCI measures the difference between the currents flowing through the hot conductor and the neutral conductor of a conventional electrical wire. If the difference between the current flowing through the hot conductor and the current flowing through the neutral conductor exceeds a few milliamps, the presumption is that current is leaking to ground via some other path. This may be because of a short circuit to, for example, the chassis of an appliance, or to the ground lead, or through a person. Any of these situations may be hazardous, so the GFCI trips, breaking the circuit. However, similar to circuit breakers, a GFCI may be a relatively slow device in order to avoid false tripping. Additionally, a GFCI is often not effective at detecting certain types of wire faults, such as arc faults.

Another safety device that is commonly installed in electrical wiring systems is an Arc Fault Circuit Interrupter (AFCI). An AFCI adds electronic protection to the standard thermal and magnetic protection provided by circuit breakers. The circuitry in an AFCI detects specific arcs that are determined to be likely to cause a fire. The AFCI uses electronics to recognize the current and voltage characteristics of the arcing faults on the electrical wire, and interrupts the circuit when a fault is detected. Each AFCI has circuit logic, and perhaps control logic, that is designed to detect specific types of arc faults. These arc faults are specific to the type of wiring the AFCI is designed to be implemented with. Additionally, in order to avoid false tripping, an AFCI circuit is typically required to analyze an electrical signature for a relatively long period of time. These delays may be hazardous, leading to property damage and/or personal injury.

Another problem with many electrical wire safety devices is that they require manual intervention and/or manual reset once a fault is detected. The electrical wire safety devices are not capable of making a determination of when a fault is no longer present on a monitored wire and, therefore, will maintain the wire in a de-energized state. This inability to determine when a fault is no longer present can lead to undesirable situations. For example, an electrical wire that provides power to a refrigerator or freezer may be de-energized by an electrical wire safety device and, if a user does not reset the safety device, perishable food items may spoil.

Accordingly, improved safety devices capable of rapidly detecting wire faults and/or other relatively dangerous conditions are desirable.

BRIEF DESCRIPTION

Embodiments of the invention include electrical safety devices and systems for use with electrical wiring, and methods for using the same. In one embodiment, an electrical safety device may be provided. The electrical safety device may include at least one current sensing device, at least one voltage sensing device, and at least one processing component. The at least one current sensing device may be configured to measure a current on at least one conductor of an electrical wire connected to a load side of the safety device. The at least one voltage sensing device may be configured to measure a voltage associated with the safety device. The at least one processing component may be configured to (i) receive the current measurement and the voltage measurement, (ii) identify, based upon the current measurement, an overcurrent event, (iii) compare, based upon the identification, the voltage measurement to a stored voltage value, (iv) determine, based upon the comparison, that a difference between the voltage measurement and the stored voltage value satisfies a threshold condition, and (v) direct, following the determination, at least one relay to be opened to discontinue provision of an electrical power signal onto the electrical wire.

According to another embodiment of the invention, an electrical safety device may be provided. The electrical safety device may include a line side interface, a load side interface, at least one relay, and at least one processing component. The line side interface may be configured to connect to a line side power source and receive an electrical power signal from the line side power source. The load side interface may be configured to connect to an electrical wire. The at least one relay may be configured to control the communication of the electrical power signal onto the electrical wire. The at least one processing component may be configured to (i) identify, based at least in part on a current measured on at least one conductor of the electrical wire, an overcurrent event, (ii) initiate, based upon the identification, an in-rush current timer, (iii) compare a measured voltage value to a stored voltage value, (iv) determine, based upon the comparison, whether a difference between the measured voltage value and the stored voltage value satisfies a threshold condition, and (v) direct, if it is determined that the threshold condition is satisfied, the at least one relay to discontinue communication of the electrical power signal onto the electrical wire, or (vi) evaluate, if it is determined that the threshold condition is not satisfied, the in-rush current timer to determine whether to discontinue communication of the electrical power signal onto the electrical wire.

According to yet another embodiment of the invention, a method for monitoring an electrical wire may be provided. An electrical safety device may measure a current on at least one conductor of an electrical wire and a voltage associated with an electrical power signal provided to the electrical wire. The electrical safety device may be a device that facilitates receipt of the electrical power signal from a line side power source and communication of the electrical power signal onto the electrical wire, and the electrical wire may be connected to a load side of the electrical safety device. Based at least in part on the current measurement, an overcurrent event may be identified. Based at least in part upon the identification of the overcurrent event, the voltage measurement may be compared to a stored voltage value. Based at least in part upon the comparison, a determination may be made that a difference between the voltage measurement and the stored voltage value satisfies a threshold condition, and communication of the electrical power signal onto the electrical wire may be discontinued by the electrical safety device based at least in part upon the determination.

Additional systems, methods, apparatus, features, and aspects are realized through the techniques of various embodiments of the invention. Other embodiments or aspects of the invention are described in detail herein and are considered a part of the claimed invention. Other advantages and features can be understood with reference to the description and drawings.

BRIEF DESCRIPTION OF THE DRAWING(S)

Having thus described the invention in general terms, reference will now be made to the accompanying drawings, which are not necessarily drawn to scale, and wherein:

DETAILED DESCRIPTION

Figure 1:
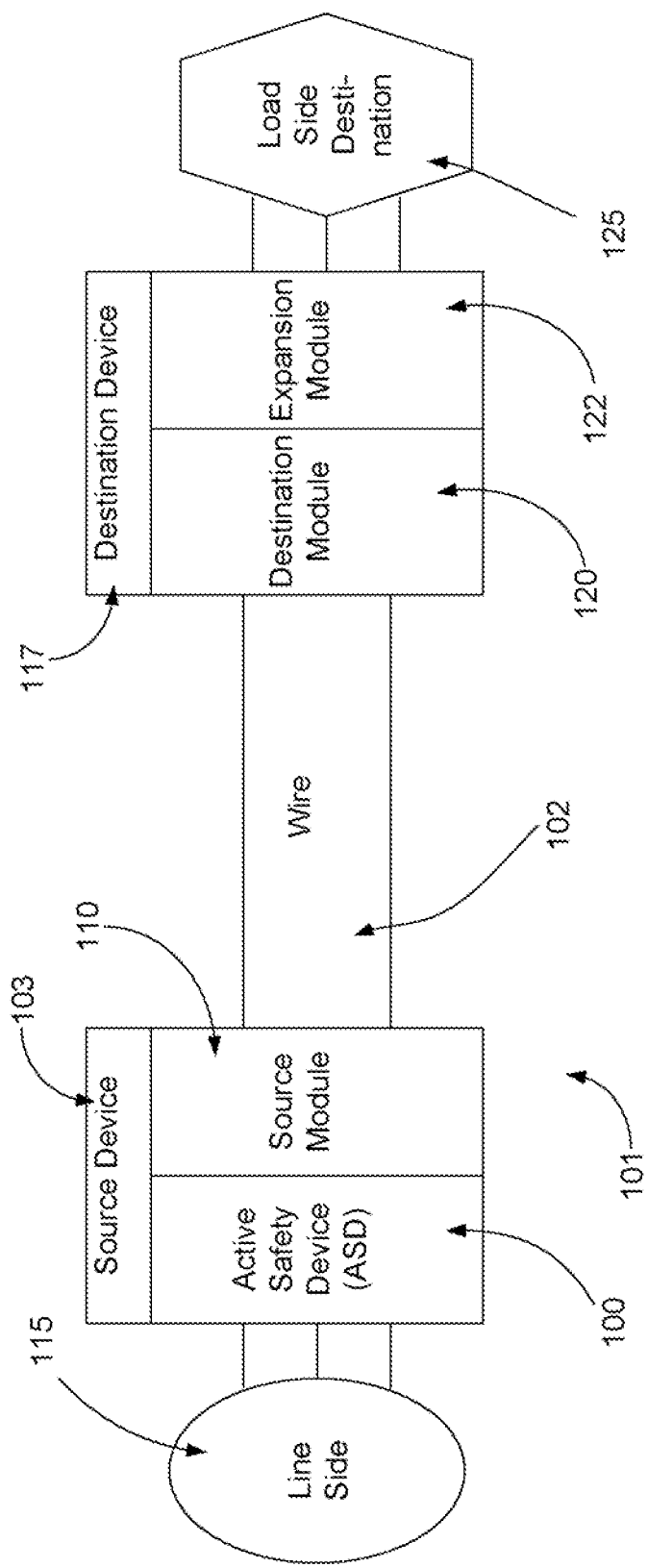
FIG. 1 is a schematic diagram of one example of a wiring system including an Active Safety Device (ASD), according to an illustrative embodiment of the invention.

The invention now will be described more fully hereinafter with reference to the accompanying drawings, in which some, but not all embodiments of the invention are shown. Indeed, embodiments of the invention may be embodied in many different forms and should not be construed as limited to the embodiments set forth herein: rather, these embodiments are provided so that this disclosure will satisfy applicable legal requirements. Like numbers refer to like elements throughout.

As used herein, the term "relay" may refer to any suitable device, component, system, and/or combination thereof that facilitates the electrification of a wire and/or control over the electrification of a wire. Examples of relays include, but are not limited to, electrical switches, mechanical switches, electromechanical switches, electromagnetic switches, triacs, and/or any other suitable disconnection component. Additionally, for purposes of this disclosure, the terms "relay" and "disconnection component" may be utilized interchangeably.

Disclosed are systems and methods for monitoring an electrical wire or electrical wiring system for miswires, wire faults, and/or unsafe conditions. An Active Safely Device (ASD) may be utilized to perform tests on a line side connection and/or a load side electrical wire prior to the electrification of the electrical wire, during the electrification of the electrical wire, and/or following the electrification of the electrical wire. If a miswire or wire fault is identified or detected by the ASD prior to the electrification of the electrical wire, then the electrical wire may be prevented from being electrified. If a miswire, wire fault, or dangerous condition is identified or detected by the ASD during or following the electrification of the electrical wire, then the electrical wire may be de-energized. An ASD may be utilized in many different types of applications, for example, in conjunction with commercial and/or residential wiring. As an example, an ASD may be utilized to monitor electrical wiring that is installed in a home or at a commercial or industrial site. The monitored electrical wiring may be wiring that is installed at the location at the time of construction or during a rewiring project.

In certain embodiments, an ASD may limit an amount of energy that is released by a wire fault or other dangerous condition present on a monitored electrical wire. In other words, the ASD may identify a potential wire fault condition or other dangerous condition, and the ASD may de-energize a monitored electrical wire within a suitable time period that limits an amount of energy released by a wire fault. The time period may be, for example, a time period equal to or less than approximately two half cycles of an alternating current electrical power signal that is provided to the electrical wire. Additionally, in certain embodiments, the amount of energy released by a wire fault may be limited to an amount that is less than a predetermined energy threshold. In this regard, the possibility of structural damage and/or personal injury resulting from the wire fault may be reduced. A wide variety of different predetermined energy thresholds may be utilized as desired in various embodiments of the invention. In certain embodiments, an energy threshold may be established by various safety standards and/or regulatory requirements. Examples of suitable energy thresholds may include energy thresholds between approximately zero joules and approximately five thousand joules. For example, an energy threshold may be between approximately five hundred joules and approximately fifteen hundred joules, although other threshold values may be utilized.

In one example embodiment of the invention, an ASD may be an electrical safety device that includes at least one current sensing device, at least one voltage sensing device, and at least one processing component. The current sensing device(s) may be configured to measure a current on at least one conductor of a load side electrical wire, such as a current on an electrifiable conductor of the electrical wire and/or a current differential between the electrifiable conductor and a return conductor of the electrical wire. The voltage sensing device(s) may measure a voltage associated with the ASD, a line side of the ASD, and/or the electrical wire, such as a voltage of an electrical power signal provided to the electrical wire. Measurements taken by the current sensing device(s) and the voltage sensing device(s) may be provided to the at least one processing component.

The at least one processing component may be configured to identify based upon the current measurement, an overcurrent event or excessive overcurrent associated with the electrical wire. For example, the processing component may compare a monitored current to a threshold current value (e.g., 20 amps, etc.), and the processing component may identify an overcurrent event if the threshold is exceeded. Once an overcurrent event has been identified, the processing component may determine whether a voltage droop has occurred in association with the overcurrent event. For example, the processing component may compare one or more received voltage measurements associated with a current half cycle of an electrical power signal provided to the electrical wire to one or more stored voltage values associated with a preceding half cycle. Based at least in part upon the comparison, the processing component may determine whether a difference between the received voltage values(s) and the stored voltage value(s) satisfies a threshold condition. If a threshold condition is satisfied, then the processing component may determine that a voltage droop has occurred in association with the overcurrent event, and the processing component may direct at least one relay to be opened to discontinue provision of an electrical power signal onto the electrical wire. In certain embodiments, identifying an overcurrent event in association with a voltage droop and discontinuing the communication of an electrical power signal onto the electrical wire may be completed within approximately two half cycles of the electrical power signal. In this regard, an amount of energy emitted by any wire faults present on the wire may be limited.

With reference to FIG. 1, an Active Safety Device (ASD) 100 implemented in an electrical wire system 101 will now be described. The electrical wire system 101 may include a source device 103, an electrical wire 102 that is monitored by the ASD 100, a line side power source 115, a destination device 117, and/or a load side destination 125. The source device 103 may include, for example, an ASD 100 and a source module 110. The destination device 117, which may be optional in certain embodiments of the invention, may include a destination module 120 and/or an expansion module 122. For purposes of this disclosure, an ASD 100 may be an electrical safety device, circuit, or module containing reactive and/or proactive safety components, circuits, and/or circuitry that facilitate the monitoring of the electrical wire 102 and/or the control of an electrical power signal as explained in greater detail below. For example, in certain embodiments, the source device 103 and its associated components, circuitry, and modules may be designated as an ASD.

The ASD 100 may be utilized to monitor a variety of different wire types, including but not limited to, a three-conductor electrical wire, a flat electrical wire, and/or other types of electrical wiring. For purposes of this disclosure, the term "wire" 102 is utilized to refer generally to a wire that may be monitored by the ASD 100, regardless of the model, type, and/or construction of the wire.

Figure 2:
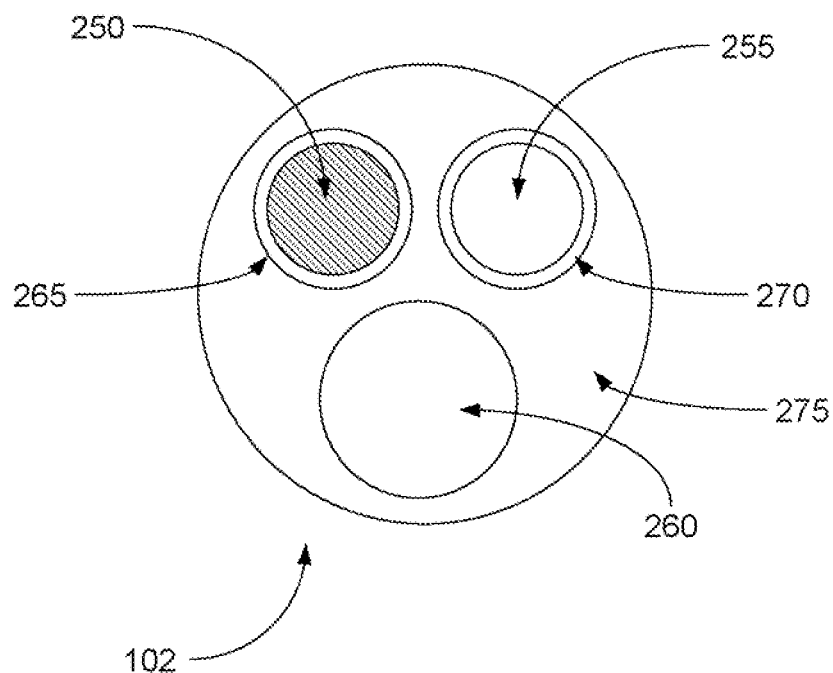
FIG. 2 is a cross-section view of an electrical wire that may be used in conjunction with an ASD, according to an illustrative embodiment of the invention.

FIG. 2 is a cross-section view of an example three-conductor electrical wire 102 that may be used in conjunction with an ASD 100, according to an illustrative embodiment of the invention. With reference to FIG. 2, the wire 102 may include an electrifiable or hot conductor 250, a return, neutral, or grounded conductor 255, and a grounding or ground conductor 260. Suitable insulation material may be wrapped around or provided for the electrifiable conductor 250 and the return conductor 255. As shown in FIG. 2, electrifiable conductor insulation material 265 may be provided for the electrifiable conductor 250 and return conductor insulation material 270 may be provided for the return conductor 255. The grounding conductor 260 may not contain its own individual insulation; however, suitable insulation material, such as thermoplastic insulation, may be provided for all three of the conductors 250, 255, 260 of the wire 102.

FIG. 2 illustrates a typical construction for an electrical wire; however, electrical wires having constructions that vary from that shown in FIG. 2 may be utilized in association with an ASD 100 in accordance with various embodiments of the invention. The wire 102 illustrated in FIG. 2 and its construction are provided merely to depict one example of a wire that may be utilized in association with an ASD 100 in accordance with certain embodiments of the invention.

With continued reference to FIG. 1, in a wire system 101, a wire 102 may be connected to the ASD 100 through a source module 110. The source module 110 may be physically separate from the ASD 100, or alternatively, the source module 110 may be integrated into the ASD 100. The source module 110 may serve as a mechanical or electromechanical connection between the wire 102 and the ASD 100. The various conductors of the wire 102 may be terminated at the source module 110. Termination points within the source module 110 may include terminal blocks, crimp-on terminals, plug and socket connectors, insulation displacement connectors (IDC), conductor penetration connectors (CPC), or any other suitable electrical connector or combination of electrical connectors. As desired, one or more appropriate detection devices may be utilized to verify that the source module 110 is connected to the ASD 100 and/or that the termination points are connected to the source module 110. For example, a ground pin or plug may be extended through the source module 110 and/or the termination points in order to detect the presence of the source module 110 and/or the termination points. As another example, an optical detection device may be utilized. Furthermore, a combination of detection devices may be utilized as desired in certain embodiments.

The ASD 100 may also be connected to a line side power source 115 or line side. The line side power source 115 may be any standard electric power source including a power wire coming from a circuit box, a conventional in-wall electrical wire, a flat electrical wire, or any other electrical wire capable of delivering electric power. In certain embodiments, the ASD 100 and the source device 103 may be situated within or near a circuit breaker. In other embodiments, the ASD 100 and the source device 103 may be situated or mounted on or within a wall of a structure. For example, the source device 103 may be integrated with and/or utilized as a power receptacle or power outlet. Typically, the line side power source 115 will carry an electrical voltage of approximately 110-130V AC or approximately 220-250V AC.

According to an aspect of the invention, the wire 102 may be connected to a load side of the source device 103. For example, the wire 102 may be connected to the source module 110, and the wire 102 and any number of downstream devices connected to the wire 102 may be monitored by the ASD 100. In certain embodiments, a load side destination 125 or other load may be connected directly to the wire 102. In other embodiments, one or more destination devices 117 may be connected to the wire 102 downstream of the ASD 100. An example destination device 117 may include a destination module 120 and an expansion module 122. Much like the source module 110, a destination module 120 may serve as a mechanical or electromechanical connection between the wire 102 and the destination device 117. The various conductors of the wire 102 may be terminated at the destination module 120. Termination points within the destination module 120 may include terminal blocks, crimp-on terminals, plug and socket connectors, insulation displacement connectors (IDCs), conductor penetration connectors (CPCs), or any other suitable electrical connector or combination of electrical connectors.

A wide variety of different types of destination devices 117 may be utilized as desired in various embodiments of the invention. In certain embodiments, a destination device 117 may form a branch connection to which the wire 102 may be connected to a line side, and a second wire may be connected to a load side. As desired, a destination device 117 may include an electrical outlet and/or a suitable ASD device. For example, the ASD 100 and source device 103 may be situated at a circuit breaker, and the destination device 117 may be a downstream electrical outlet that includes additional electrical safety devices, such as a second ASD.

As desired, an expansion module 122 may be included in a destination device 117, and the expansion module 122 may serve as a mechanical or electromechanical connection between the destination device 117 and a load side destination 125. A load side destination 125 may include, for example, a power outlet or receptacle, a wired device, a terminal block, a safety component, "flying leads," or any other suitable load side connection as desired in various embodiments. Termination points within the expansion module 122 used to connect the load side destination 125 to the expansion module 122 may include terminal blocks, crimp-on terminals, plug and socket connectors, insulation displacement connectors (IDCs), conductor penetration connectors (CPCs), or any other electrical connector as desired in various embodiments. Additionally, in certain embodiments of the invention, the load side destination 125 may be connected to the destination module 120 as an alternative to being connected to the expansion module 122.

The load side destination 125 may include a wide variety of different types of loads to which an electrical power signal is provided by the wire 102. In certain embodiments, a load side destination 125, such as an electrical outlet, may be connected directly to the wire. In other embodiments, a load side destination 125 may be connected to and/or integrated into a destination device 117. For example, a destination device 117 may include an electrical outlet, and a load (e.g., a lamp, vacuum cleaner, etc.) may be plugged into the electrical outlet.

Figure 13:
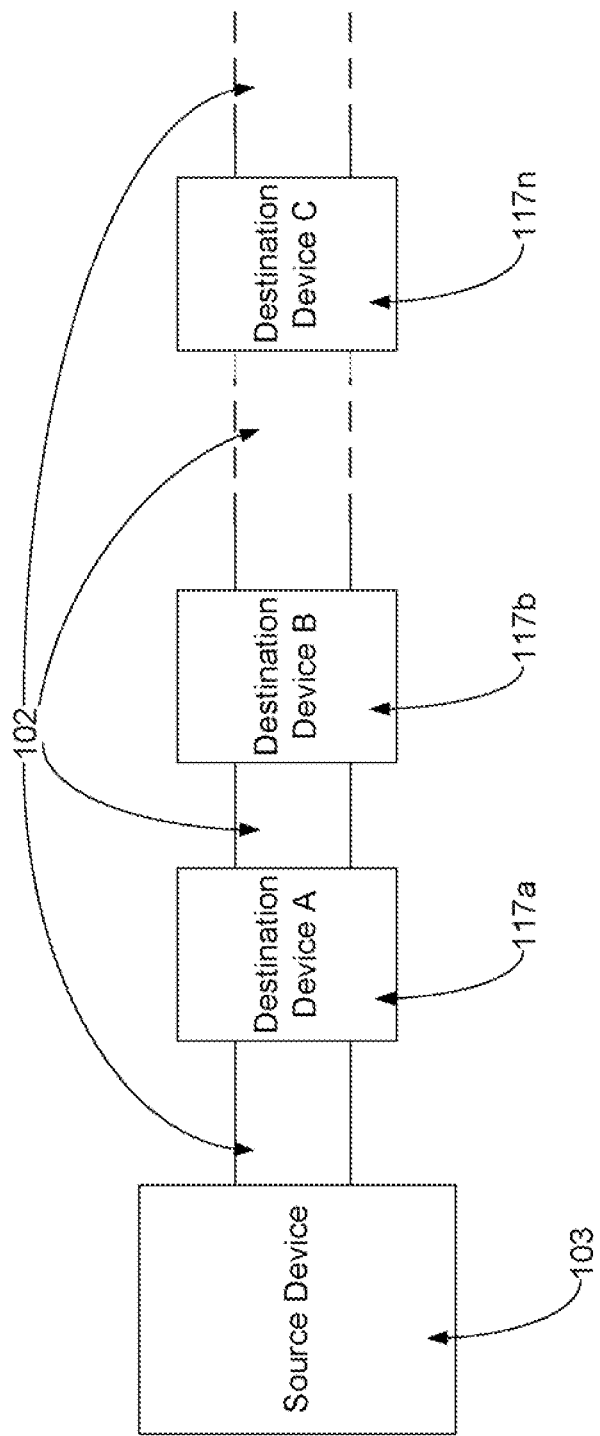
FIG. 13 is a schematic diagram of multiple destination devices in a serial configuration being supported by a single source device, according to an illustrative embodiment of an aspect of the invention.

Additionally, in certain embodiments, an expansion module 122 may be used to create a mechanical or electromechanical connection between the destination device 117 and a second destination device, as explained in greater detail below with reference to FIG. 13. In such an embodiment, a second wire 102 may be connected to the expansion module 122 and used to create a connection between the expansion module 122 and the second destination device. Termination points within the expansion module 122 may include terminal blocks, crimp-on terminals, plug and socket connectors, insulation displacement connectors (IDCs), conductor penetration connectors (CPCs), or any other electrical connector as desired in various embodiments.

Additionally, as explained in greater detail below, the destination device 117 may be capable of communicating with the ASD 100 through the source module 110 over one or more suitable conductors of the wire 102. The destination device 117 may also be capable of communicating with a second destination device through the expansion module 122 over a second wire 102. In this regard, a home network may be formed in which communication is facilitated between various safety devices and/or destination devices.

Figure 3:
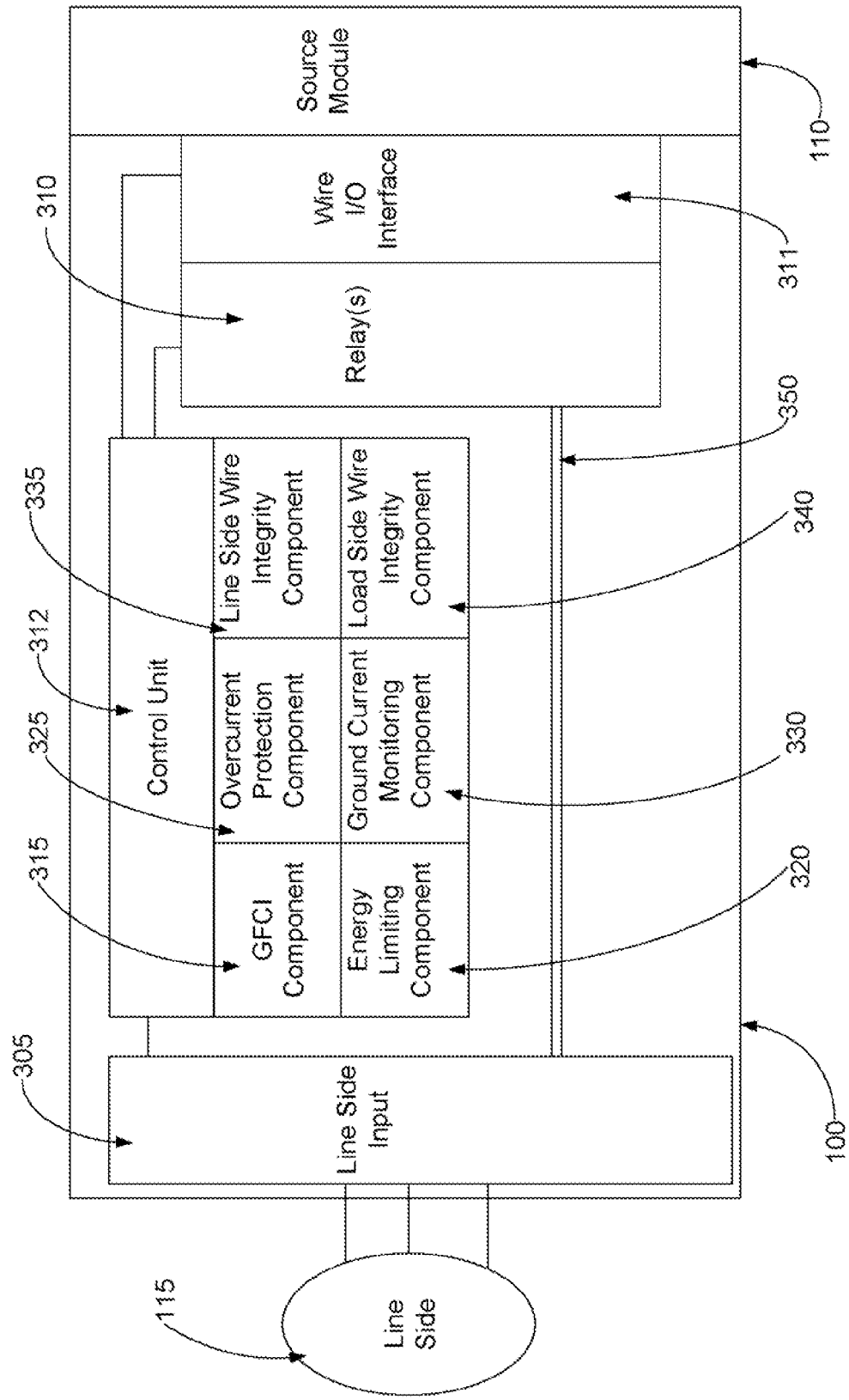
FIG. 3 is a block diagram of the components of an example ASD, according to an illustrative embodiment of the invention.

FIG. 3 is a block diagram of the example components of an ASD, such as the ASD 100 illustrated in FIG. 1. The ASD 100 may include a line side input 305, one or more relays 310, a wire input/output (I/O) interface 311, a control unit 312, and various safety components including one or more of a GFCI component 315, an energy limiting component 320, an overcurrent protection component 325, a ground current monitoring component 330, a line side wire integrity component 335, and/or a load side wire integrity component 340.

The ASD 100 may be powered by a power source, which may be connected to the ASD 100 at the line side input 305. For example, the line side power source 115 illustrated in FIG. 1 may be connected to the line side input 305 of the ASD 100 to provide power to the ASD 100. Further, the one or more relays 310 may control the flow of an electrical signal, which may be an electrical power signal, from the power source through the ASD 100 to a source module, such as the source module 110 illustrated in FIG. 1. The source module 110 may provide the electrical power signal to an electrical wire, such as the wire 102 illustrated in FIG. 1. Each of the one or more relays 310 may be, for example, a double pole single throw (DPST) relay. As desired, a multitude of other relays and/or types of relays may be used by the ASD 100 including, but not limited to, one or more single pole single throw (SPST) relays, one or more single pole double throw (SPDT) relays, one or more single pole changeover or center off (SPCO) relays, one or more double pole double throw (DPDT) relays, and/or one or more double pole changeover or center off (DPCO) relays.

In certain embodiments, the ASD 100 may, include one or more common or main relays 310. Additionally or alternatively, the ASD 100 may include multiple respective relays associated with the various safety components of the ASD 100. For example, each safety component of the ASD 100 may include subordinate or dedicated relays or, alternatively, various components of the ASD 100 may share one or more common or main relays 310. As another example, a separate relay may be provided for various conductors of a wire 102 that is connected to the source module 110. For example, a first relay may be provided for the electrifiable or hot conductor 250 of the wire 102, and a second relay may be provided for the return or neutral conductor 255 of the wire 102.

Each of the relays may be actuated independently of one another or, alternatively, a plurality of the relays may be jointly actuated. As desired, the ASD 100 may utilize one or more relays to communicate test signals onto the wire 102 without providing an electrical power signal to the electrifiable conductor 250 of the wire 102. In this regard, the ASD 100 may proactively monitor the wire 102 for wire faults and/or miswires prior to electrification of the wire 102 and/or following the identification of a wire fault or unsafe condition while the wire 102 is electrified or energized. For example, as explained in greater detail below with reference to FIG. 9, a suitable test relay may be utilized to communicate a test signal onto the wire 102 in order to determine whether a short exists between an electrifiable conductor and a return conductor of the wire 102.

For purposes of this disclosure, the ASD 100 will be referred to as including one or more common relays 310 that facilitate the provision of an electrical power signal onto the wire 102. The ASD 100 may maintain the one or more relays 310 in either an opened position or a closed position. When the relays 310 are maintained in a closed position, electrical power may be permitted to flow from a line side power source 115 through the ASD 100 to the source module 110. As shown in FIG. 3, an ASD pOwer line 350 may be included in the ASD 100 to carry the electrical power from the line side input 305 through the ASD 100 to the source module 110; however, in certain embodiments of the invention, the electrical power may be propagated through the ASD 100 via circuitry other than an ASD power line 350, such as through the various individual safety components of the ASD 100. The ASD power line 350 is included in this disclosure for simplification purposes in order to facilitate the understanding of the invention. From the source module 110, the electrical power may then be transmitted onto the wire 102.

Alternatively, when the relays 310 are maintained in an opened position, an electrical signal is not allowed to flow from a line side power source 115 through the ASD 100 to the source module 110. As desired, the ASD 100 may be configured to default to maintaining the relay 310 in an opened position. By defaulting to an opened position, the ASD 100 may ensure that no faults are present in the wire system 101 prior to full electrification or energization of the wire system 101. Accordingly, whenever the ASD 100 loses power, if the relay 310 is not in an opened position, the relay 310 may be switched to an opened position in order to permit the ASD 100 to perform tests on the wire system 101.

In certain embodiments, the relays 310 may be part of or associated with a zero crossing circuit. Alternatively, the zero crossing circuit may be a part of the control unit 312, and the control unit 312 may receive a power signal, such as an alternating current power signal, from the line side input 305 and provide a coil control signal (such as a 120V AC, 24V DC or 12V DC signal) to the relays 310. A zero crossing circuit is an electrical circuit that detects an alternating current load voltage at or close to zero phase occurring once for each alternating current half cycle. The zero crossing circuit may be used in connection with the opening or closing of the relays 310 in order to assist in opening or closing the relays 310 at a point in time that is close to the zero phase of the input signal. Zero crossing circuits may work on voltage zero crossings or on current zero crossings. The zero crossing circuit may take into account inherent turn-on and turn-off delays associated with the relays 310 when making zero crossing contact closures or breaks of the main relay 310. Since typical power systems in many countries run at 60 cycles per second or Hertz (Hz), a zero crossing occurs approximately every 8.3 milliseconds (ms). A typical relay 310 may have, for example, a 5 millisecond actuation time (closing time) and a 3 millisecond break time (opening time). In this example, for zero crossing turn-on, the relay coil may be energized for 3.3 ms (or the 8.3 ms cycle time—the 5 ms actuation time) after the last zero crossing of the input signal to produce a contact closure (actuation) of the relay 310 at the next zero crossing of the input signal. Similarly, in the same example, the relay coil may be de-energized for 5.3 ms (or the 8.3 ms cycle time—the 3 ms break time) after the last zero crossing to produce a contact break (de-actuation or opening) at the next zero crossing of the input signal. Accordingly, the output of power from the ASD 100 onto the wire 102 may start as soon as possible once the relays 310 are closed. Additionally, the input waveform from the line side 115 will match the output waveform across the wire 102 as closely as possible meaning that less energy is dissipated in the ASD 100 and source module 110 circuitry. The ability of the ASD 100 to perform a zero cross turn-on or turn-off of the relay 310 may extend the lifetime of the contacts in the relays 310, limit the contact arc-showering effect, limit electromagnetic emissions, and limit conducted electrical noise from the relays 310.

In order to facilitate proactive testing, one or more of the relays 310 may be actuated for a relatively short period of time in which tests may be performed on the wire 102. For example, one or more relays 310 may be actuated for a period of time that is less than or approximately equal to the time that it takes for one half of a typical power cycle. In this regard, the ASD 100 may test one or more conductors of the wire 102 during the time that the relays 310 are actuated.

According to another aspect of the invention, the ASD 100 may be able to detect slow breaking (i.e., sticky) contacts in the relays 310. The control unit 312 of the ASD 100 may monitor the contact break times of the relays 310 with a counter or other timing device. The control unit 312 may directly monitor the break time of the relays 310, or the control unit 312 may monitor the break time of the relays 310 by receiving information from the wire I/O interface 311. By monitoring the break time of the relays 310, the control unit 312 may detect a slow break time for a relay 310. For preventive maintenance purposes, the ASD 100 may alert a user of these slow breaking contacts so that the ASD 100 may be repaired or replaced. The user may be alerted in a number of ways by the ASD 100. One possible method for alerting a user is to activate an LED on the exterior of the ASD 100 that will alert the user to the potential main relay contact problems. Another method for alerting the user is to transmit a communication from the ASD 100 to either another ASD 100, a central hub or control panel, or some other device, as will be explained in greater detail below with reference to FIGS. 13-15.

According to another aspect of the invention, the ASD 100 may include a control unit 312. The control unit 312 may control the various safety components of the ASD 100. Alternatively, each individual safety component of the ASD 100 may include its own control unit, or various components of the ASD 100 may share control units. The control unit 312 may include any number of suitable processor-driven devices that facilitate control of the ASD 100. For example, the control unit 312 may contain one or more microcontrollers and associated components such as resistors, diodes, capacitors, and crystals. Other suitable devices and associated circuitry for controlling an electronic circuit include, but are not limited to, one or more programmable logic arrays, a state machine, a mini-computer, or a general purpose computer along with any associated firmware and software. The execution of programmable logic, computer-executable instructions, and/or software components by one or more processors of the control unit 312 may form a special purpose computer or a particular machine that is operable to monitor the wire 102 and/or control the electrification of the wire 102. As desired, many different types of control units may be incorporated into, associated with, or be in communication with the ASD 100. In certain embodiments, a control unit may be external to and/or located remotely to the ASD 100, and the control unit may communicate with the components of the ASD 100 via a suitable network connection, for example, a wired network connection or a wireless network connection.

According to an aspect of the invention, the control unit 312 may be configured to or be operable to store various types of data associated with the operation of the ASD 100. The data may include data associated with the operation of the various safety components of the ASD 100. Additionally, the data may include measurements data that has been taken while monitoring the wire 102 and/or line side of the ASD 100 in accordance with the operation of the various safety components of the ASD 100. For example, the data may include voltage and/or current measurements taken by the ASD 100. The data may also include one or more counters associated with the operation of the ASD 100 and the various safety components of the ASD 100. For example, the data may include a number of counters associated with the recognition of wire faults, miswires, or dangerous conditions by the ASD 100 and/or the various safety components of the ASD 100. As one example, a special reset counter may be stored. The special reset counter may be utilized to track a number of times that the ASD 100 is reset by a user pressing and holding (e.g., holding for approximately three seconds) a reset button associated with the ASD 100. In this regard, tripping events that may reduce a lifespan of the relay contacts, such as relatively high current tripping events, may be tracked. Once a value of the special reset counter has reached a threshold value, the ASD 100 may be placed in a fatal alarm state and rendered unusable with the relays opened. An indication may be displayed or presented by the ASD 100 in order to inform a user that the ASD 100 should be replaced. In this regard, situations in which the relay contacts become temporarily or permanently stuck in a closed position may be reduced and/or avoided.

The stored data may be utilized during subsequent operations of the ASD 100. For example, data stored in association with the operation of a safety component of the ASD 100 may later be utilized in association with the operation of the safety component of the ASD 100 and/or in association with the operation of other safety components (or the control unit 312) of the ASD 100. A wide variety of data may be stored by the ASD 100 or by one or more memory devices associated with the ASD 100 as desired in various embodiments. The data items that may be stored by the ASD 100 include, but are not limited, to those listed in Table 1 below:

TABLE 1

Data Items that May be Stored

| Data Item | Type | Initial Value |
|---|---|---|
| Hot Relay Normal Actuations Count | counter | 0 |
| Hot Relay Normal Actuations Limit for end of life | limit | 75000 |
| Hot Relay High Current Actuations Count | counter | 0 |
| Hot Relay High Current Actuations Limit for end of life | limit | 5 |
| Special Reset Count | counter | 0 |
| Special Reset Limit | limit | 20 |
| Fatal Non-resetable (internal) Fault Code | code | 0 |
| Non-fatal Limited Resetable Fault Count | counter | 0 |
| Non-fatal Unlimited Resetable Fault Count | counter | 0 |
| Hot Relay Actuation Time | value | 0 |
| Hot Relay Release Time | value | 0 |
| Fault code #1 count | counter | 0 |
| Fault code #2 count | counter | 0 |
| Fault code #3 count | counter | 0 |
| Fault code #4 count | counter | 0 |
| Fault code #5 count | counter | 0 |
| Fault code #6 count | counter | 0 |
| Fault code #7 count | counter | 0 |
| Fault code #8 count | counter | 0 |
| Fault code #9 count | counter | 0 |
| Fault code #10 count | counter | 0 |
| Fault code #11 count | counter | 0 |
| Fault code #12 count | counter | 0 |
| Fault code #13 count | counter | 0 |
| Fault code #14 count | counter | 0 |
| Fault code #15 count | counter | 0 |
| Fault code #16 count | counter | 0 |
| Fault code #17 count | counter | 0 |
| Fault code #18 count | counter | 0 |
| Fault code #19 count | counter | 0 |

Other data items may be stored by the ASD 100 as desired in various embodiments of the invention. Additionally, in certain embodiments of the invention, the initial values of one or more of the data items may be different than those listed in Table 1. With reference to Table 1, the Hot Relay Normal Actuations Count may keep track of the number of times that a hot relay 310 is actuated during the normal course of the operation of the ASD 100; the Hot Relay Normal Actuations Limit may establish a limit for the normal actuations of the hot relay 310 during the lifetime of the ASD 100; the Hot Relay High Current Actuations Count may keep track of the number of times that the hot relay 310 is tripped as a result of a high current event, as explained in greater detail below with reference to FIG. 4A; the Hot Relay High Current Actuations Limit for end of life parameter may establish a limit for the number of high current actuations of the hot relay 310 during the lifetime of the ASD 100, as explained in greater detail below with reference to FIG. 4A; the Special Reset Count may keep track of a number of times that the ASD 100 is reset by a user; the Special Reset Limit may establish a limit for the number of times the ASD 100 may be reset; the Fatal Non-resetable Fault Code may establish a code to be stored for any identified Fatal Non-resetable Faults; the Non-fatal Limited Resetable Fault Count may keep track of the number of Non-fatal Limited Resetable Faults that are identified: the Non-fatal Unlimited Resetable Fault Count may keep track of the number of Non-fatal Unlimited Resetable Faults that are identified; the Hot Relay Actuation Time parameter may establish a value for the time that it takes to actuate the relays 310; the Hot Relay Release Time parameter may establish a value for the time that it takes to release the relays 300; and the parameters for Fault Codes 1-19 Counts may keep track of the number of different types of faults that are identified by the ASD 100.

Many different types of faults may be identified as desired in various embodiments of the invention. As desired, each fault may be associated with its own counter. Additionally, the tracking of faults in one or more memories and/or control units 312 associated with the ASD 100 may facilitate post mortem failure analysis and/or detections of abuse or misuse of an ASD 100. As one example, an ASD 100 may track the number of GFCI trips, overcurrent trips, self-test failures, and/or other types of identified faults as desired. The tracking of these various types of faults may then be utilized in a determination of the reasons that a lifetime counter (as discussed below with reference to FIG. 4A) of the ASD 100 has been reached. Additionally and/or alternatively, the tracking of these various types of faults may be utilized in a determination of abuse or misuse of an ASD 100, such as overloading a circuit.

The ASD 100 may utilize one or more values and/or parameters stored in memory during the monitoring of a wire 102. The ability to store values and/or parameters in a memory of the ASD 100 may facilitate additional monitoring capabilities of the ASD 100. For example, the use of a memory may facilitate the continued monitoring of a wire 102 in which a fault has been identified in order to determine whether the fault is still present on the wire. In this regard, the ASD 100 may determine if and when a fault is no longer present on a monitored wire 102 and re-energize the wire 102 when the fault is no longer present. As another example, the use of a memory may facilitate a determination of whether a voltage droop has occurred in association with an identified overcurrent event.

As an example, an ASD 100 may be utilized to monitor an energized wire 102. If a fault is detected on the wire 102, then the one or more relays 310 of the ASD 100 may be opened, and the wire 102 may be de-energized. One or more flags may be set within the memory of the ASD 100 indicating that a fault has been detected on the wire 102 while the wire was energized. While the one or more flags are set, the ASD 100 may continually or periodically test the wire 102 in order to determine whether the fault is still present on the wire 102. For example, the ASD 100 may test the wire 102 every ten minutes or every hour (or at any other desired time interval) in order to determine whether the fault is still present on the wire 102. If, at any time, it is determined that the fault is no longer present on the wire 102, then the one or more relays 310 of the ASD 100 may be closed, allowing the wire 102 to be re-energized.

The ability to automatically test a wire 102 in which a fault has been previously identified may allow electrical devices that are connected downstream from the wire 102 to receive power again after it has been determined that a fault is no longer present on the wire 102. Additionally, these downstream devices may receive power without any user actions being taken in association with the wire 102 and/or ASD 100. For example, a fault, such as a ground fault, may be identified in a wire 102 that supplies power to a refrigerator. It may later be determined that the fault is no longer present on the wire 102, and the wire 102 may be re-energized, thereby allowing the refrigerator to receive power again. The refrigerator may receive power again without any user interaction, such as a user resetting the ASD 100.

In addition to testing a wire 102 in which, a fault has been previously identified, the ASD 100 may also be utilized to retest the line side power source 115 following the identification of an unsafe line side condition. For example, the ASD 100 may identify a power surge event associated with the line side power source 115, such as a power surge associated with a lightning strike. Following the identification of the power surge event, the ASD 100 may de-energize the load side wire 102. The ASD 100 may then monitor the line side power source 115 and/or the wire 102 in order to determine whether the power surge event has been cleared and/or whether any faults are present on the wire 102. If the ASD 100 determines that no unsafe conditions are present, then the wire 102 may be re-energized. In this regard, downstream loads, such as a refrigerator or freezer, may be permitted to receive power without a manual user reset of the ASD 100.

Figure 4A:
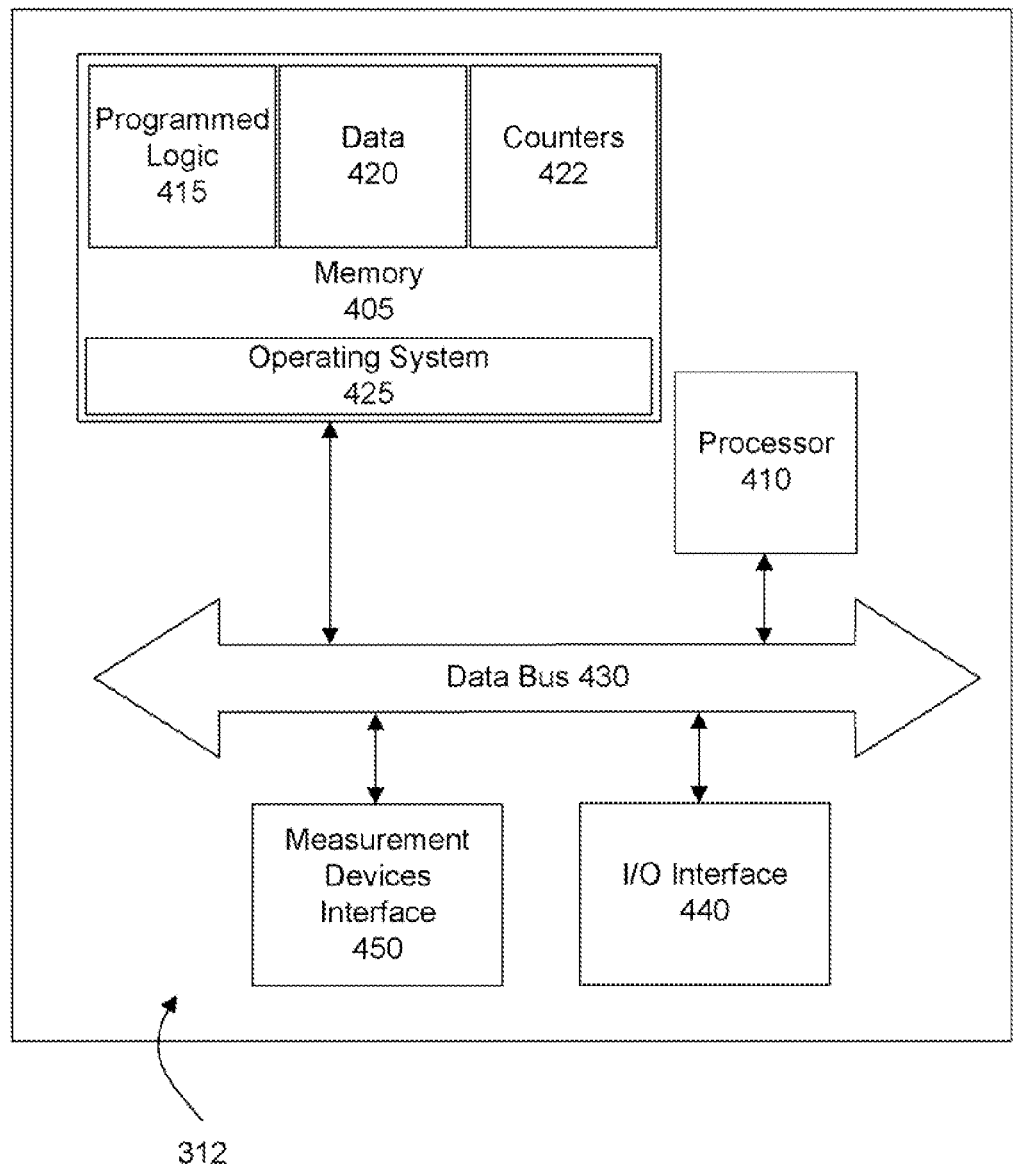
FIG. 4A is a block diagram of an example control unit that may be associated with an ASD according to certain embodiments of the invention.

FIG. 4A is a block diagram of one example of a control unit 312 that may be associated with an ASD 100 according to certain embodiments of the invention. The control unit 312 may include one or more suitable memory devices 405 and one or more processors 410. Any number of suitable memory devices 405 may be utilized as desired in embodiments of the invention, for example, caches, read-only memories, random access memories, magnetic storage devices, etc. The memory devices 405 may store programmed logic 415 (e.g., software code, computer-executable instructions, etc.) in accordance with various embodiments the invention. The memory devices 405 may also include measurements data 420 utilized in the operation of the invention, counters, timers, or states 422 utilized in the operation of the invention, and/or an operating system 425. The one or more processors 410 may utilize the operating system 425 to execute the programmed logic 415, and in doing so, may also utilize the measurements data 420. The programmed logic 415 may include the logic associated with the operation of the one or more safety components of the ASD 100. Execution of the programmed logic 415 by the one or more processors 410 may form a special purpose computer or a particular machine that facilitates the control of the ASD 100, the monitoring of a wire 102 connected to the ASD 100, and/or the electrification of the wire 102. As desired, an optional data bus 430 may provide communication between the memory devices 405 and the one or more processors 410. The control unit 312 may be in communication with the other components of the ASD 100 and perhaps other external devices, for example, lights, light emitting diodes (LEDs), LED displays, other displays, speakers, keyboards, mouse devices, and other user interface devices, as well as data lines connected to other ASDs or electrical appliances, via an I/O Interface 440. Additionally, measurement devices configured to take various electrical measurements of the wire 102 may be in direct communication with the control unit 312 via a measurement devices interface 450 or, alternatively, may communicate with the control unit 312 via the I/O Interface 440. These measurement devices may be included in the wire 110 interface 311, as described in greater detail below. Further, the control unit 312 and the programmed logic 415 implemented thereby may comprise software, hardware, firmware or any combination thereof.

The control unit 312 may control and/or include the various safety components of the ASD 100. Additionally, the control unit 312 may store data relating to the status of the wire system 101. For example, the control unit 312 may maintain flags or states for each of the safety components of the ASD 100 in order to determine when to trip the relay 310 of the ASD 100 and to indicate, in the event of a miswire, fault detection or identification of a dangerous condition, which safety component identified the miswire, fault, or dangerous condition. The control unit 312 may also store measurements data 420 associated with the operation of the various safety components of the ASD 100. In addition, before the relay 310 of the ASD 100 is closed, allowing a wire 102 to be electrified, the control unit 312 may cause one or more safety components to test the wire 102 for miswire and/or wire faults. The control unit 312 may also be configured to take a control action when a miswire, wire fault, or unsafe condition associated with the wire 102 is detected. In addition to maintaining or forcing the one or more relays 310 into an open position, a control action may include an action that informs a user of the ASD 100 about the detection of the miswire, fault, or unsafe condition. For example, a visual indicator, such as an LCD display or one or more LEDs may be included in the ASD 100, and the display or LEDs may be actuated in such a manner as to inform a user of the detection and the nature of the detected event. As one example, the ASD 100 may include a single LED that is activated by the control unit 312 when an event is detected to inform a user of the detected event. As an alternative example, the ASD 100 may include an LED associated with each safety component of the ASD 100 and, when an event is detected, the control unit 312 may activate the LED associated with the safety component that detected the event. Another control action that may be taken by the control unit 312 is the transmission of a message indicating the detected event. The control unit 312 may transmit the message to another ASD 100, to a central hub or control panel, or to another destination, as will be explained in greater detail below. Other indicators, such as audible alarms, may additionally or alternatively be utilized by the ASD 100 as desired in various embodiments of the invention. Indicators that may be used by the ASD 100 beneficially add to the overall safety of the ASD 100 by informing a user of a fault, miswire, or unsafe condition and potentially pinpointing a fault or miswire for the user.

The control unit 312 may also include one or more counters and/or timers 422. Counters and/or timers 422 associated with each safety component may be used by the control unit 312 to track the number of times a particular safety component has detected a miswire, wire fault, or unsafe condition associated with the wire 102. Additionally, a universal counter or timer may be used to track the number of times the ASD 100 has detected a miswire, wire fault, or unsafe condition in the wire system 101. Separate counters may also be utilized to track different types of detected events. These counters and/or timers 422 may be used to monitor the wire system 101, and may be used to generate states that indicate the current condition of the wire system 101. The counts and/or states may be used to perform preventive maintenance on the wire system 101. The storage capability of the counters and/or timers 422 may also be non-volatile, for example, in a non-volatile memory, so that information including counts and states are not lost during a power outage or brown-out condition.

According to an aspect of the invention, the control unit 312 may additionally include at least one lifetime counter and/or a special reset counter. In certain embodiments, each relay 310 may have a lifetime associated with it. In other words, a relay 310 may cease to operate properly after it has been actuated normally for a certain number of times or after it has been tripped several times as the result of a detected high current event. For normal actuations of the relay 310, the lifetime of the relay may be a relatively large value, for example, the value shown for the Hot Relay Normal Actuations Limit for end of life parameter of Table 1. For the number of trips due to detected high current events, a predicted lifetime of, the relay 310 may be similar to a mean trips to failure for the relay 310, for example, the value shown in the Hot Relay High Current Actuations Limit for end of life parameter of Table 1. Similarly, a limit may be placed on the number of times that the ASD 100 and its associated relays 310 are reset. Different types of relays 310 that may be utilized by the ASD 100 may be associated with different lifetimes. A lifetime counter or special reset counter associated with a relay 310 may be configured to count down from or up to a predetermined threshold value. The threshold value may be a value that is less than or equal to the predicted lifetime of a relay 310. For example, if the predicted lifetime of a relay is 55-75 high current trips, then the threshold value may be established as fifty (50) trips of the relay 310. Once the relay 310 has been tripped a number of times equal to, the threshold value, the ASD 100 may deactivate the relay 310 and prevent the relay 310 from being closed by a user event, for example, a reset of the ASD 100. Utilizing the example of the relay 310 with a threshold value established as fifty trips, the ASD 100 may be automatically reset or reset as a result of user interaction following the first forty-nine trips of the relay 310; however, once the relay 310 has tripped for the fiftieth time, the ASD 100 will prevent a further reset. In such a situation, the user may be required to return or send the ASD 100 to a retailer, distributor, manufacturer, or repair center associated with the ASD 100 in order to have the relay 310 and/or the ASD 100 tested, updated, and/or replaced. The lifetime counter may prevent a situation in which the ASD 100 and the relay 310 are reset, but the relay 310 is not capable of tripping when a miswire, wire fault, or unsafe condition is detected by the ASD 100.

In certain embodiments, each of the one or more lifetime counters of the ASD 100 may be associated with specific types of errors detected by the ASD 100. For example, the lifetime counter may be associated with errors that lead to a tripping of a relay 310 due to a high current event, thereby causing an electrified wire 102 to be de-energized. In certain embodiments, not all errors detected or detectable by the ASD 100 will lead to a tripping of a relay 310 as a result of a high current event. For example, an error detected prior to the electrification of the wire 102 may not lead to a tripping of a relay 310. According to an aspect of the invention, there are three different types of exceptions or alarms that may be recognized by the ASD 100. The first type of alarm is a fatal non-resetable alarm, which may be recognized if a failure of any of the internal circuitry of the ASD 100 is detected. For example, a fatal non-resetable alarm may be recognized if a stuck relay is identified, if a fuse incorporated into the ASD 100 is blown, if a detected signal is outside of a detectable range, if a failure of self-test circuitry associated with the ASD 100 is detected, and/or if a lifetime counter has exceeded or reached a threshold value. The second type of alarm is a non-fatal limited resetable alarm, which may be an alarm that is associated with a high current event on the wire 102. For example, a non-fatal limited resetable alarm may be recognized if an overcurrent event is detected on an electrified wire 102. The third type of alarm may be a non-fatal unlimited resetable alarm, which may be associated with a non-fatal alarm that does not involve a high current event. In certain embodiments, the ASD 100 may allow an unlimited number of the third type of alarm to occur: however, as desired, a limit may be associated with this type of alarm. An ASD 100 in accordance with various embodiments of the invention may recognize many different types of alarms and that those alarms described herein are merely examples of the various types of alarms and should not be construed as limiting.

Figure 4B:
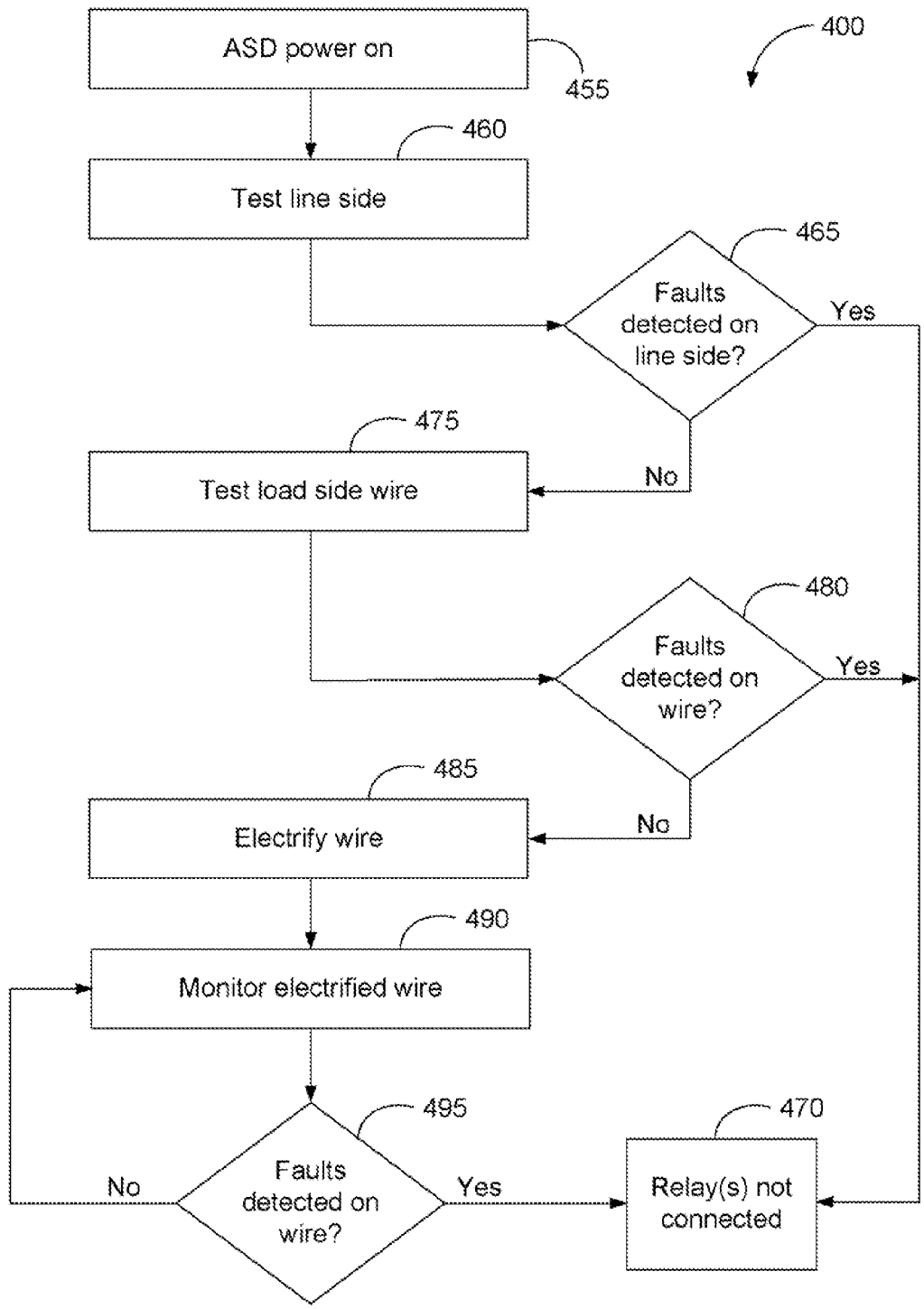
FIG. 4B is a flow diagram of one example method for the operation of the control unit of FIG. 4A, according to an illustrative embodiment of the invention.

FIG. 4B is a flow diagram of one example method 400 of the general operation of the ASD 100 of FIG. 3 and the control unit 312 of FIG. 4A, according to an illustrative embodiment of the invention. The operations described in FIG. 4B may include the operations that are performed by the ASD 100 to monitor a wire 102. At block 455, power may be applied to the ASD 100, and the ASD 100 may commence operation at block 460. At block 460, the ASD 100 may test the line side 115 for miswires. If a line side miswire is detected at block 465, then operations may continue at block 470, and the ASD 100 may prevent the one or more relays 310 from being closed, thereby preventing the electrification of the wire 102. If, at block 465, no line side miswires are detected by the ASD 100, then operations may continue at block 475, and the ASD 100 may proactively test the load side wire 102 and/or any other wires or devices connected on the load side for miswires and/or wire faults. If at block 480, a miswire or wire fault is detected on the wire 102, then operations may continue at block 470, and the ASD 100 may prevent the one or more relays 310 from being closed, thereby preventing the electrification of the wire 102. If, however, at block 480, no miswires and/or wire faults are detected on the wire 102, then operations may continue at block 485. At block 485, the one or more relays 310 of the ASD 100 may be closed, and the wire 102 may be electrified. During the electrification of the wire 102 and/or after the wire 102 has been electrified, the ASD 100 may reactively monitor the wire 102 and/or any other wires or devices connected on the load side for wire faults and/or unsafe conditions at block 490. If a fault or unsafe condition is detected on the wire 102 or on the load side at block 495, then operations may continue at block 470, and the ASD 100 may open the one or more relays 310, thereby causing the wire 102 to be de-electrified or de-energized. If, however, no wire faults or unsafe conditions are detected on the wire 102 or on the load side at block 495, then operations may return to block 490, and monitoring of the wire 102 may continue.

The tests performed by the control unit 312 do not necessarily have to be performed in the order set forth in the logic of FIG. 4B, but instead may be performed in any suitable order. Additionally, the control unit 312 does not have to conduct each test set forth in FIG. 4B, but instead may conduct less than all of the tests set forth in FIG. 4B. Additionally, if a miswire, wire fault, or unsafe condition is detected by the control unit 312 or by a safety component in communication with the control unit 312, then an indicator may be stored by the control unit 312 or the associated safety component, and the indicator may include information as to which test(s) resulted in the detection of the miswire, wire fault, or unsafe condition. This indicator may then be transmitted by the ASD 100 to another device such as a second ASD 100, a central monitoring device, or a computer.

With continued reference to FIG. 3, the ASD 100 may include both reactive and/or proactive safety components. A reactive safety component of the ASD 100 may detect a wire fault or unsafe condition in the wire 102 after the wire 102 has been fully electrified. A reactive safety component may also detect a wire fault or unsafe condition during the full electrification of the wire 102 or during the time period that it takes to fully electrify the wire 102 after a full electrification signal is allowed to flow onto the wire 102. In other words, a reactive safety component may detect wire faults or unsafe conditions while a voltage in the range of approximately 90 to 130V AC (for a standard 120V AC power system, such as a North American power system) or a voltage in the range of approximately 220 to 250V AC (for a standard 240V AC power system, such as a European power system) is present on the electrical wire 102. Each country or region may have differing voltage or current standards that may be taken into account in the design and implementation of the ASD 100. Additionally, in certain embodiments of the invention, one or more reactive tests may be conducted constantly following the electrification of the wire 102. Alternatively, one or more reactive tests may be conducted periodically following the electrification of the wire 102.

A proactive safety component of the ASD 100 may detect a wire fault or miswire prior to full power electrification of the wire 102. In other words, a proactive safety component may perform checks or tests on the electrical wire 102, for example, checks or tests that involve the communication of voltage or current test signals onto the wire 102, prior to allowing full electrification of the wire 102.

Reactive safety components of the ASD 100 may include, for example, one or more of a ground fault circuit interrupter (GFCI) 315, an energy limiting component 320, an overcurrent protection component 325, and a ground current monitoring component 330. Proactive safety components of the ASD 100 may include, for example, one or more of a line side wire integrity component 335 and a load side wire integrity component 340. Each of these safety components is discussed in greater detail below.

The reactive and proactive safety components of the ASD 100 may utilize various electrical measurements associated with the line side and/or the wire 102 connected to the ASD 100 and/or the source module 110 in determining whether or not a miswire condition, unsafe condition, or wire fault exists on either side of the ASD 100. The ASD 100 may utilize the various measurements to detect miswires and/or unsafe conditions on the line side of the ASD 100 and to detect miswires, wire faults and/or unsafe conditions on the wire 102 connected on the load side of the ASD 100. The ASD 100 may include a wire I/O interface 311 that is capable of taking electrical measurements associated with the various conductors of the wire 102 and/or the conductors of the line side connected to the ASD 100. Alternatively, these electrical measurements may be taken by the various components of the ASD 100.

For example, either the wire I/O interface 311 and/or the components of the ASD 100 may measure the voltage, current, impedance, resistance or any other electrical characteristic associated with the wire 102. For example, either the wire I/O interface 311 or the components of the ASD 100 may measure the current present on any of the conductors of a wire 102 with any number of suitable current measuring or current sensing devices, such as current transformers, Hall effect devices, and/or devices that detect voltage differentials over a series of resistors. As another example, the wire I/O interface 311 or the components of the ASD 100 may measure the voltages present on any of the conductors of a wire 102, the voltage present in the ASD 100, and/or the voltages on any of the conductors of the line side with any number of suitable voltage measuring devices or voltage sensing devices, such as a signal conditioning circuit or a volt meter. Each component of the ASD 100 may include measurement devices associated with that component or, alternatively, one component of the ASD 100 may make use of a measurement device used by another component of the ASD 100. As desired in certain embodiments, the ASD 100 may include a single set of measurement devices in the wire I/O interface 311 that is used by all of the components of the ASD 100, as shown in FIG. 3.

Additionally, the wire I/O interface 311 or the components of the ASD 100 may include excitation circuitry or devices that are capable of communicating a signal onto one or more of the conductors of the wire 102. Excitation circuits or devices may be capable of communicating a current signal onto one or more of the conductors of the wire 102. Suitable excitation circuits or devices for communicating a current signal onto one or more of the conductors of the wire 102 include, but are not limited to, current transformers, current sources, isolators, multiplexers, and relays. As an alternative to, or in addition to transmitting a current signal onto the wire 102, excitation circuits or devices may be capable of transmitting a voltage signal onto one or more conductors of the wire 102. Suitable excitation circuits or devices for transmitting a voltage signal onto one or more conductors of the wire 102 include, but are not limited to, voltage transformers, multiplexers, drivers, and voltage sources. Each component of the ASD 100 may include excitation circuit devices associated with that component or, alternatively, one component of the ASD 100 may make use of an excitation device used by another component of the ASD 100. The ASD 100 may also include a single set of excitation circuits or devices in the wire I/O interface 311 that is used by all of the components of the ASD 100, as shown in FIG. 3. As explained in greater detail below, the excitation devices may be used in conjunction with the measurement devices to perform tests on the wire 102.

The reactive and proactive safety components of the ASD 100 may operate independently of one another, or, alternatively, their operation may be controlled by the control unit 312. In the illustrative embodiment of FIG. 3 with a single set of measurement devices contained within a wire I/O interface 311, the individual safety components may receive electrical measurements from the wire I/O interface 311 or, alternatively, the individual safety components may receive electrical measurements from the wire I/O interface 311 through the control unit 312 or through another safety component. Additionally, one or more of the various safety components of the ASD 100 may share one or more circuit components.

According to an aspect of the invention, a ground fault circuit interrupter (GFCI) safety component 315 may be associated with the ASD 100, which will be referred to herein as a GFCI component 315. The GFCI component 315 may detect ground faults in a wire 102 that is monitored. A ground fault is an unintentional electric path which diverts current to ground. In operation, the GFCI component 315 may monitor the current differential between the electrifiable conductor 250 and the return conductor 255 of the wire 102. If the current flowing through the electrifiable conductor 250 differs from the current flowing through the return conductor 255 by more than a predetermined threshold amount, then the GFCI component 315 may cause the ASD 100 to open the one or more relays 310 in order to de-energize the wire 102.

Additionally, the trip time of the GFCI component 315, or the time it takes the GFCI component 315 to open a relay 310, may vary with the current differential detected by the GFCI component 315. For example, a slower trip time may be associated with a smaller current differential, and a faster trip time may be associated with a higher current differential. In certain embodiments, the trip time of the GFCI component 315 may be a linear function of the current differential detected by the GFCI component 315. In other embodiments, the trip time of the GFCI component 315 may be a non-linear function of the current differential detected by the GFCI component 315, such as that defined by UL943, a standard established by Underwriters Laboratories, Inc. (UL).

According to another aspect of the invention, the ASD 100 may include an energy limiting safety component 320, which will be referred to as an energy limiting component. The energy limiting component 320 may be a suitable safety component that limits the energy released by wire faults, such as wire penetrations. In operation, the energy limiting component 320 may be configured to reactively monitor the electrical wire 102 and identify overcurrent events that may be associated with a wire fault. For example, the energy limiting component 320 may monitor a current on one or more conductors of the electrical wire 102, such as a current on the electrifiable conductor 250 of the electrical wire 102. The monitored current may be compared to one or more threshold current values, and an overcurrent event may be identified based at least in part upon a determination that the monitored current exceeds a threshold value. For example, in embodiments utilizing an electrical power signal of approximately 120V AC, an excessive overcurrent event may be identified if a monitored current exceeds approximately twenty (20) amps or some other suitable threshold value. As another example, in embodiments utilizing an electrical power signal of approximately 240V AC, an excessive overcurrent event may be identified if a monitored current exceeds approximately ten (10) amps or some other suitable threshold value. Indeed, a wide variety of suitable threshold values may be utilized as desired, and the values described are provided by way of example only.

Once an overcurrent event has been identified, the energy limiting component 320 may determine whether a voltage droop is associated with the identified overcurrent event. For example, the energy limiting component 320 may monitor or identify a voltage associated with the electrical power signal provided from the line side input 305 through the ASD 100 to the electrical wire 102. The monitored voltage may be measured, for example, at the line side input 305, by the wire I/O interface 311, and/or at any other points within the ASD 100 and/or the energy limiting component 320. In certain embodiments, one or more voltage measurements may be taken during a current half cycle of the electrical power signal. As desired, the amplitudes of the one or more voltage measurements may be determined and the sign of the voltage measurements (i.e., whether the current half cycle is a positive half cycle or a negative half cycle) may be disregarded.

The one or more voltage measurements may be compared to one or more stored voltage values. For example, one or more voltage measurements for a current half cycle of the electrical power signal may be compared to one or more corresponding stored voltage values for a previous half cycle, such as the half cycle that immediately preceded the current half cycle. Based at least in part on the comparison, a determination may be made as to whether a voltage droop condition has occurred. For example, an amplitude differential between the current voltage value(s) and the stored voltage value(s) may be determined. A determination may then be made as to whether the voltage amplitude(s) have decreased or dropped by a value or percentage that exceeds a voltage threshold value or percentage. If it is determined that a reduction or drop in the voltage exceeds a voltage threshold value or percentage, then a determination may be made that a voltage droop has occurred. A wide variety of voltage threshold values may be utilized as desired in various embodiments of the invention, such as a percentage value of approximately fifty percent (50%) or some other suitable percentage.

In certain embodiments, a plurality of voltage measurements may be taken and compared to a corresponding plurality of stored voltage values. In one example embodiment, thirty-two (32) voltage samples or measurements may be taken during a current half cycle of the electrical power signal although other numbers of samples may be taken as desired. The absolute value of each voltage sample may be compared to an absolute value of a stored corresponding sample. For example, a first sample value from a current half cycle may be compared to a corresponding stored first sample value of a previous half cycle. A voltage droop may then be identified if a sufficient number of voltage samples have a reduced value relative to the corresponding stored sample values. In certain embodiments, a voltage droop may be identified if a series of one or more sample voltages have a reduced value relative to a corresponding series of stored sample values. For example, a voltage droop may be identified if three or more successive voltage samples have a reduced value relative to corresponding stored sample values that exceeds a voltage droop threshold. In this regard, false trips stemming from abnormal or stray voltage sample measurements may be avoided or reduced. Additionally, in certain embodiments, voltage sample values taken at or near a zero crossing may be ignored for voltage droop calculations.

Additionally, as desired, the energy limiting component 320 may replace the stored voltage value(s) with the voltage measurement(s). For example, the energy limiting component 320 may store the values of one or more current voltage measurements in a memory in place of the previously stored voltage value(s). As one example, one or more current voltage values and/or voltage samples may be stored in a suitable shift register, memory array, or other suitable memory following the comparison of the current voltage value(s) to the corresponding stored value(s). In this regard, the current voltage measurements may be utilized in a subsequent comparison by the energy limiting component 320.

The energy limiting component 320 may detect potential wire faults and/or unsafe conditions, such as wire penetrations, based at least in part upon an identified overcurrent event in combination with a voltage droop. As a result of determining whether a voltage droop corresponds to an overcurrent event, the energy limiting component 320 may reduce the chances of a false trip resulting from in-rush current, such as an increase in current caused by plugging in an electrical appliance or connecting another electrical load. Once an overcurrent condition in combination with a voltage droop has been identified, the energy limiting component 320 may direct the one or more relays 310 to be opened in order to de-energize the electrical wire 102. According to an aspect of the invention, a relatively fast trip time may be achieved by the energy limiting component 320. For example, in certain embodiments of the invention, an unsafe condition may be detected during a first half cycle of the electrical power signal, and the one or more relays 310 may be opened during a second half cycle of the electrical power signal. With an approximately 60 Hz electrical power signal, an unsafe condition may be identified, and the relay(s) may be opened within approximately seventeen (17) milliseconds. With an approximately 50 Hz electrical power signal, an unsafe condition may be identified, and the relay(s) may be opened within approximately twenty (20) milliseconds. This reaction time may be decreased with improvements in relay technology and relay response time. As a result of the relatively fast trip time of the energy limiting component 320, an amount of energy released by any wire faults (e.g., a point of penetration) may be limited. For example, the energy release may be limited to less an amount of energy less than a predetermined energy threshold. A wide variety of different predetermined energy thresholds may be utilized as desired in various embodiments of the invention. In certain embodiments, an energy threshold may be established by various safety standards and/or regulatory requirements. Examples of suitable energy thresholds may include energy thresholds between approximately zero joules and approximately five thousand joules. For example, an energy threshold may be between approximately five hundred joules and approximately fifteen hundred joules, although other threshold values may be utilized.

A wide variety of different types of unsafe conditions and/or wire faults may be identified or detected by the energy limiting component 320. Examples of conditions that may be identified include, but are not limited to, wire penetrations, arc faults, arcing conditions, and/or structural defects associated with the wire 102.

Additionally, in certain embodiments, the energy limiting component 320 and/or other safety components of the ASD 100, such as the overcurrent protection safety component 325 may utilize one or more timers to monitor current in the event that an overcurrent event is identified without a corresponding voltage droop. For example, an in-rush timer and/or an excessive overcurrent timer may be utilized to monitor the current, and an unsafe condition may be identified based upon expiration of one or more of the timers. These timers are explained in greater detail below with reference to FIG. 10. Additionally, the operations of the energy limiting component 320 are explained in greater detail below with reference to FIG. 10.

According to another aspect of the invention, an overcurrent protection safety component 325 may be associated with the ASD 100, which will be referred to herein as an overcurrent protection component 325. The overcurrent protection component 325 may provide primary and/or secondary overcurrent protection. If too much current is allowed to flow through a monitored wire 102, then the wire 102 may overheat, and there is a potential that a fire could be started in nearby combustibles such as wood, paper and carpets. The overcurrent protection component 325 may provide secondary overcurrent protection in addition to that provided by a standard circuit breaker. Typically, circuit breakers are rated with a maximum current that they can effectively handle in order to trip properly, and a circuit breaker may be ineffective if the current flowing through a circuit (which may be created by a short) is higher than the maximum rated current of the circuit breaker. If such a situation arises, the overcurrent protection component 325 of the ASD (which may provide secondary overcurrent protection. Alternatively, the overcurrent protection component 325 may provide primary overcurrent protection if there is no circuit breaker connected to or associated with the line side power supply 115 or if a connected circuit breaker is ineffective. For example, the overcurrent protection component 325 would provide primary overcurrent protection if a homeowner closed a circuit in a fuse panel by placing a penny across a fuse.

The overcurrent protection component 325 of the ASD 100 may monitor the current flowing through the electrifiable conductor 250 of a monitored wire 102. If the current flowing through the electrifiable conductor 250 increases above a maximum threshold value, the one or more relays 310 may be opened to de-energize the wire 102. As desired, the maximum threshold current value may be set at many different values.

For instance, the overcurrent protection component 325 may cause the relay(s) 310 to open if the current in the electrifiable conductor 250 exceeds approximately 15 amps (for 120V AC applications) for a threshold period of time. An overcurrent protection component 325 may also examine the current flowing through the return conductor 255 of the wire 102 in a similar manner to that described above for the electrifiable conductor 250.

In certain embodiments, the overcurrent protection component 325 may utilize a variable scale algorithm in its monitoring of the current associated with the electrifiable conductor 250. Based at least in part on the level or amount of overcurrent present on the electrifiable conductor 250, the overcurrent protection component 325 may have a variable trip time, or time it takes to de-actuate or open the one or more relays 310. For example, if the maximum allowable current on the electrifiable conductor 250 is set at 15 amps and the overcurrent protection component 325 measures a current of approximately 15.1 amps on the electrifiable conductor 250, then the trip time of the overcurrent protection component 325 may be approximately one second. The trip time may or may not be adjusted for the next zero crossing condition. Alternatively, if a current of approximately 50 amps or more is detected on the electrifiable conductor, then the trip time of the overcurrent protection component 325 may be an approximately immediate trip time (no added delay) or set for the next zero crossing condition. Having a longer trip time at lower overcurrent levels may serve to mitigate false tripping situations due to load in-rush currents on the wire 102. Many different smart algorithms with a Wide array of trip times may be utilized as desired in conjunction with the overcurrent protection component 325 of certain embodiments of the invention. Additionally, the trip time of the overcurrent protection component 325 may be a linear function of the amount of overcurrent detected by the overcurrent protection component 325. Alternatively, the trip time of the overcurrent protection component 325 may be a non-linear function of the amount of overcurrent detected by the overcurrent protection component 325.

According to yet another aspect of the invention, the ASD 100 may include a ground current monitoring safety component 330 to perform ground current monitoring, which will be referred to herein as a ground current monitoring component 330. The ground current monitoring component 330 may be utilized as either a reactive component or in conjunction with the proactive components of the ASD 100. During normal operation, there should not be any significant current on a grounding conductor 260 of the wire 102.

The ground current monitoring component 330 may monitor the current flowing through the grounding conductor 260 of the wire 102. If the current increases above a predetermined maximum threshold value, then the one or more relays 310 may be opened to de-energize the wire 102. As desired, the maximum threshold current value may be set at many different values. For instance, the ground current monitoring component 330 may open the relays 310 if the current in the grounding conductor 260 exceeds approximately 3.0 milliamps.

According to an aspect of the invention, the ASD 100 may be powered by the line side power source 115. Additionally, as desired, the ASD 100 may include any number of batteries, capacitors, or other backup power supplies that facilitate operation in the event of a power outage, a miswiring on the line side, or an open conductor condition on the line side.

The ASD 100 may include more or less than the components illustrated in FIG. 3, The ASD, 100 illustrated in FIG. 3 is provided by way of example only and is not intended to be limiting.

Figure 5:
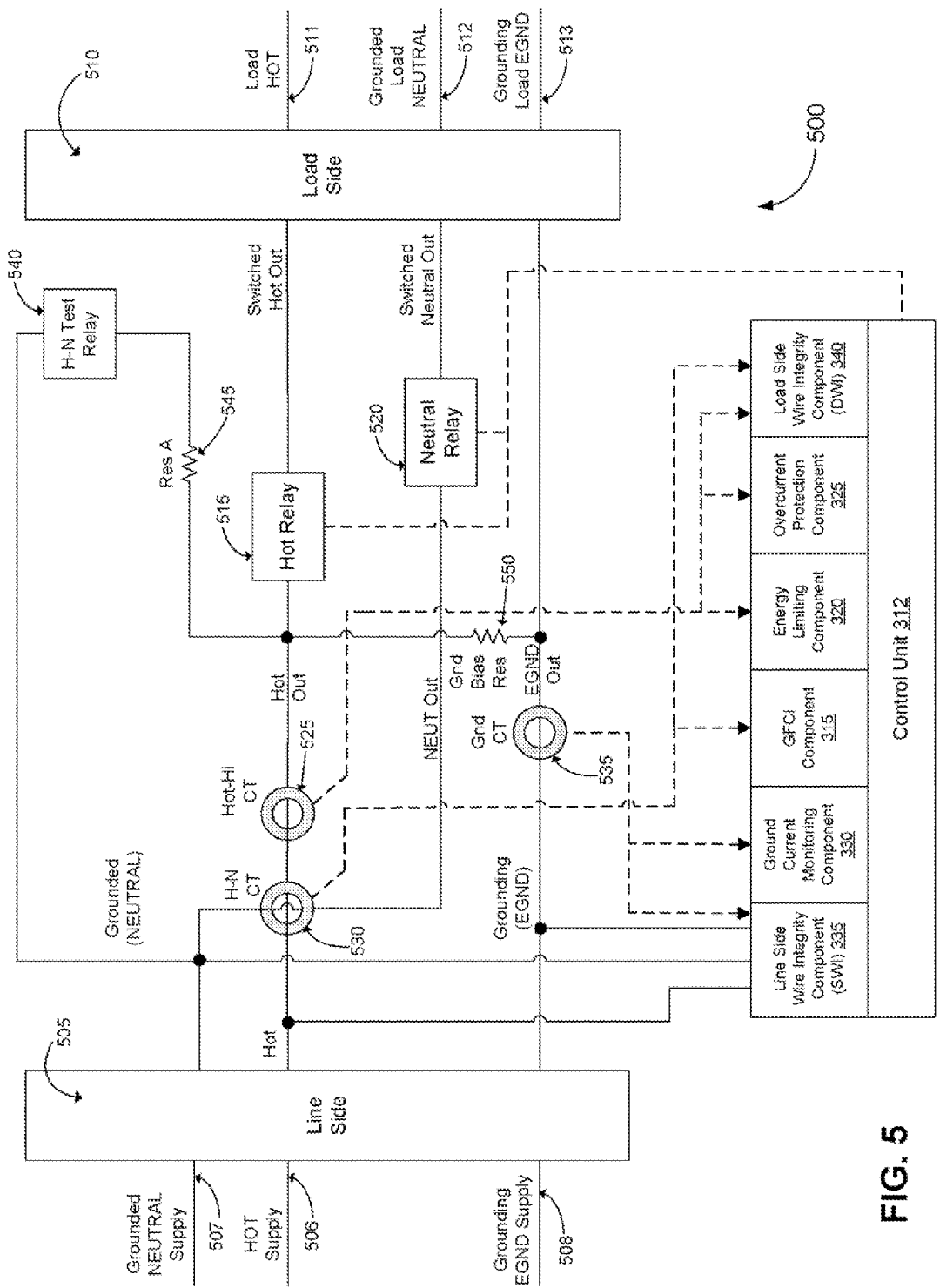
FIG. 5 is a schematic diagram of one example ASD, according to an embodiment of the invention.

FIG. 5 is a schematic diagram of one example ASD 500, according to an embodiment of the invention. The ASD 500 illustrated in FIG. 5 may be, for example, an ASD that is installed within a wall. For example, the ASD 500 may be integrated into an in-wall electrical outlet. Additionally, the ASD 500 includes a wide variety of different types of safety components that facilitate reactive and/or proactive testing of an electrical wire, such as the wire 102 illustrated in FIG. 1.

With reference to FIG. 5, a line side power source, such as a three-conductor electrical wire, may be connected to a line side input 505 of the ASD 500. For example, an electrifiable (or hot) conductor 506, a return (or neutral or grounded) conductor 507, and a ground (or grounding) conductor 508 may be connected to the line side input 505. Additionally, an electrical wire 102 may be connected to a load side terminator 510 of the ASD. For example, an electrifiable conductor 511, a return conductor 512, and a grounding conductor 513 may be connected to the load side terminator 510. A hot relay 515 and a neutral relay 520 may control the provision of an electrical power signal from the line side input 505 to the load side terminator 510 and onto the wire 102. When the relays 515, 520 are closed, a received electrical power signal will be communicated onto the wire 102. Similarly, when the relays 515, 520 are opened, the ASD 500 will prevent the electrical power signal from being communicated onto the wire 102.

Additionally, a plurality of current sensing devices may be included in the ASD 500. The current sensing devices may facilitate the measurement of currents present on or associated with one or more conductors of the wire 102. As desired, a wide variety of different types of current sensing devices may be utilized in various embodiments of the invention, such as current transformers (CTs). Hall effect devices, and/or devices that detect voltage differentials across a series of resistors. With reference to FIG. 5, a first current transformer 525 (referred to as a Hot-Hi CT) may be configured to measure relatively high currents on the electrifiable conductor 511 of the wire 102, a second current transformer 530 (referred to as a H-N CT) may be configured to measure a current differential between the electrifiable conductor 511 and the return conductor 512 of the wire, and a third current transformer 535 (referred to as a Gnd CT) may be configured to measure a current on the ground conductor 513 of the wire. Other current transformers and/or current sensing devices may be utilized as desired in various embodiments of the invention. The Hot-Hi CT 525 may facilitate the identification of overcurrent events associated with the wire 102. The H-N CT 530 may facilitate GFCI functionality as well as the detection of relatively low current test signals that may be communicated onto the wire 102. The Gnd CT 535 may facilitate ground current monitoring operations and/or the identification of a line side open ground condition.

In addition to including one or more current sensing devices, the ASD 500 may include one or more suitable voltage sensing devices, such as a suitable signal conditioning circuit or a volt meter incorporated into a control unit or processing component of the ASD 500. The current sensing devices and/or the voltage sensing devices may provide measurements data to the control unit, which may be similar to the control unit 312 described above with reference to FIGS. 3, 4A, and 4B. As desired, any number of analog-to-digital converters may be utilized to process received measurements in order to provide digital values to the control unit 312.

In certain embodiments of the invention, one or more test relays may be incorporated into the ASD 500. The test relays may facilitate the provision of a relatively low current test signal onto one or more conductors of the wire 102. In this regard, various wire faults and/or miswires may be proactively identified by the ASD 500 either prior to electrifying the wire 102 or following the identification of a fault on the wire 102. With reference to FIG. 5, a hot to neutral (H-N) test relay 540 may facilitate connection of the hot output of the ASD 500 to the return or neutral line side. As desired, one or more suitable resistors, such as resistor A 545 may be provided in order to limit or reduce the current passed through the H-N test relay 540 that will be utilized as a test signal. As desired, the current may be limited to any appropriate value, for example, a value between approximately six (6) mA and approximately one hundred (100) mA. In certain embodiments, the current of the test signal may be limited to approximately twenty (20) mA.

As stated above, the control unit 312 may be similar to the control unit described above with reference to FIGS. 3, 4A, and 4B. Accordingly, the control unit 312 may be a suitable microcontroller or other suitable processing component configured to receive and process measurements data associated with the line side input 505 and/or the monitored wire 102. In this regard, the control unit 312 may identify a wide variety of wire faults, miswire conditions, and/or unsafe conditions. As shown in FIG. 5, the control unit 312 may include functionality associated with a wide variety of different safety components, such as the safety components described above with reference to FIG. 3. For example, a line side wire integrity (SWI) component 335, a ground current monitoring component 330, a GFCI component 315, an energy limiting component 320, an overcurrent protection component 325, and/or a load side or destination wire integrity (DWI) component 340 may be associated with the control unit 312. Each of these components may be suitable software components or modules that facilitate monitoring of the line side input 505 and/or the wire 102.

The SWI component 335 may be configured to perform a wide variety of line side miswire tests and/or checks associated with the line side input 505 of the ASD 500. For example, the SWI component 335 may identify open conductors on the line side and/or reversed or miswired conductors on the line side of the ASD 500. An open conductor may occur as a result of a wiring error or due to a relatively bad connection of a conductor, such as a loose, corroded, or broken connection. Additionally, an open conductor condition may occur over time even if the initial connection of the conductor was proper. The SWI component 335 may receive a wide variety of inputs as desired in various embodiments of the invention. For example, with reference to FIG. 5, the SWI component 335 may receive as inputs a value of the hot voltage relative to the neutral voltage, a value of the ground voltage, and/or a value of the current flowing through the Gnd CT 535.

In operation, the SWI component 335 may proactively and/or reactively identify an open electrifiable conductor 506, an open return conductor 507, and/or an open ground conductor 508. An open electrifiable conductor 506 or an open return conductor 507 may be identified by detecting a lack of power supplied to the ASD 500 (e.g., identifying a lack of power supplied to an ASD 500 having a battery backup) and/or by detecting various biasing conditions between a hot input and a neutral input to a signal conditioning circuit associated with the SWI component 335.

In the event of an open ground conductor 508, the power supply of the ASD 500 and the control unit 312 may function properly. An open ground conductor 508 may be proactively identified by detecting a relatively high or abnormally high voltage at the ground input or EGND input. This relatively high voltage may be caused by current floating from the hot or electrifiable output of the ASD 500 through a suitable ground bias resistor 550 (e.g. a 120 kilo ohm resistor for an ASD 500 that receives a 120V AC power signal). For example, a voltage detected at the ground input may be compared to an open ground threshold voltage value. A wide variety of voltage threshold values may be utilized as desired to proactively detect an open ground conductor 508, such as a value of approximately twenty (20) volts or greater.

An open ground conductor 508 may be reactively identified by detecting a relatively low or abnormally low current at the Gnd CT 535 input of the SWI component 335. The low current event may result from an interruption of the current flowing from the hot or electrifiable output of the ASD 500 through the ground bias resistor 550 through the Gnd CT 535. For example, a measurement value received from the Gnd CT 535 may be compared to an open ground threshold current value, and an open ground conductor may be reactively identified based at least in part on the comparison. A wide variety of threshold current values may be utilized as desired to reactively detect an open ground conductor 508, such as a value less than approximately one (1) milliamps.

In the event of a proactive identification of an open conductor, the SWI component 335 may maintain the hot relay 515 and the neutral relay 520 in an opened position, thereby preventing electrification of the wire 102. In the event of a reactive identification of an open conductor, the SWI component 335 may cause the relays 515, 520 to be opened, thereby de-energizing the wire 102. Additionally, as desired, an appropriate indication of the open conductor may be output by the ASD 500. For example, an LED may be activated in order to output an indication of an open conductor condition.

Additionally, the SWI component 335 may identify a situation in which the electrifiable conductor 506 and the return conductor 507 have been reversed when connected to the line side input 505. In this type of reversal situation, the power supply to the ASD 500 may be operative, thereby allowing a detection of the reversal. In one example embodiment, a suitable signal condition circuit associated with the SWI component 335 may be utilized to analyze the voltage supplied to the SWI component 335 in order to identify a situation in which the electrifiable conductor 506 and the return conductor 507 have been reversed. For example, the SWI component 335 may identify an abnormal voltage difference between a neutral input supplied to the ASD 500 and a ground input supplied to the ASD. The reversal situation may be identified proactively, and the relays 515, 520 may be prevented from closing based at least in part upon the identification. Additionally, as desired, an appropriate indication (e.g., an LED indication, etc.) of the miswire condition may be output by the ASD 500.

Additionally, as desired in certain embodiments, the SWI component 335 may reactively monitor the electrical power signal that is received from the line side input. For example, the SWI component 335 may reactively monitor a voltage of the received electrical power signal. In this regard, the SWI component 335 may identify brownout conditions, blackout conditions, and/or over voltage conditions. Assuming a 120V AC electrical power signal, a brownout condition may be identified when a line side voltage is between approximately 75V AC and approximately 102V AC. Based upon an identification of a brownout condition, the SWI component 335 may take a wide variety of control actions. For example, the SWI component 335 may output an appropriate indication (e.g., an LED indication, etc.) of the brownout condition.

Similarly, a blackout condition may be identified when a line side voltage is less than approximately 75V AC. Based upon an identification of a blackout condition, the SWI component 335 may take a wide variety of control actions. For example, the SWI component 335 may open the relays 515, 520, and the SWI component 335 may output an appropriate indication (e.g., an LED indication, etc.) of the blackout condition. Finally, an over voltage condition may be based upon a determination that the line side voltage exceeds an over voltage threshold value, such as a value of approximately 138V AC. Based upon an identification of an over voltage condition, the SWI component 335 may take a wide variety of control actions. For example, the SWI component 335 may open the relays 515, 520, and the SWI component 335 may output an appropriate indication (e.g., an LED indication, etc.) of the brownout condition.

One example of the operations that may be performed by the SWI component 335 in order to test for proper line side connections is described in greater detail below with reference to FIG. 8A.

The DWI component 340 may be configured to identify a wide variety of open conductors, miswires, and/or wire shorts on the wire 102 connected to the load side of the ASD 500. For example, the DWI component 340 may be configured to proactively test the wire 102 for shorts between various conductors of the wire 102. In certain embodiments, the DWI component 340 may proactively test the wire for a short between the load side return conductor 512 and the load side ground conductor 513. This type of short may typically be caused by a penetration of the wire 102. Additionally, the testing may be performed by the DWI component 340 before electrification of the wire 102 and/or following the identification of a wire fault or unsafe condition by another component of the ASD 500, such as the energy limiting component 320.

To facilitate testing for a short between the return conductor 512 and the ground conductor 513, the H-N test relay 540 may be closed. In this regard, current may flow from the hot output of the ASD 500 through resistor A 545 and the H-N test relay 540 to the line side return point. According to an aspect of the invention, the current flowing through the H-N test relay 540 may be reduced to a relatively low value. A portion of the test current may flow through the H-N CT 530 to the neutral output of the ASD 500 and onto the return conductor 512 of the wire 102. In the event of a load side short between the return conductor 512 and the ground conductor 513, the test current will continue to flow via the fault or point of penetration onto the ground conductor 513 of the wire. The test current may flow through the Gnd CT 535 to the line side ground and then to earth ground. A short may be identified based upon the detection of the test current by the Gnd CT 535. Alternatively, a short may be identified by measuring the associated imbalance current at the H-N CT 530 taking the value of resistor A 545 into account. For example, if a differential current is detected by the H-N CT 530, such as a current greater than approximately one or two milliamps, then a likely short may be detected.

In addition to monitoring the line side of the ASD 500 and/or proactively testing the wire 102 for shorts, the ASD 500 may additionally perform a wide variety of reactive tests on the wire 102. For example, the ASD 500 may reactively monitor the wire for a wide variety of different high current events and/or dangerous conditions. With reference to FIG. 5, the ground monitoring component 330 may receive measurements data from the Gnd CT 535 and determine whether a current is present on the ground conductor 513 of the wire. If the ground monitoring component 330 detects a sufficient current on the ground conductor 513, then the ground monitoring component 330 may open the relays 515, 520 in order to de-energize the wire 102. Additionally, the ground monitoring component 330 may output an indication of the detected ground current and/or take any number of other desired control actions.

The GFCI component 315 may receive measurements data from the H-N CT 530 and monitor the current differential between the electrifiable conductor 511 and the return conductor 512 of the wire 102. The GFCI component 315 may identify ground faults by determining whether the current differential exceeds a predetermined threshold value or amount. If a GFCI component 315 detects a ground fault, then the GFCI component 315 may open the relays 515, 520 in order to de-energize the wire 102. Additionally, the GFCI component 315 may output an indication of the detected ground fault and/or take any number of other desired control actions.

The energy limiting component 320 and/or the overcurrent protection component 325 may monitor the electrifiable or hot conductor 511 of the wire 102 for overcurrent events and/or excessive overcurrent events. For example, the overcurrent protection component 325 may receive measurements data from the Hot-Hi CT 525 and determine, based upon the received measurements data, the current flowing through the electrifiable conductor 511. The overcurrent protection component 325 may compare the measured current to one or more overcurrent threshold values (e.g., a value of between approximately 15 amps and approximately 20 amps). If it is determined that the measured current exceeds or satisfies an overcurrent threshold value, then the overcurrent protection component 325 may initiate an overcurrent in-rush timer. If the value of the current falls below the overcurrent threshold value (e.g., 15 amps) prior to expiration of the overcurrent in-rush timer, then the overcurrent protection component 325 may determine that the overcurrent event has been cleared, and the relays 515, 520 may be maintained in a closed position. In this regard, nuisance or false tripping resulting from switching on user loads may be reduced or avoided. If, however, the overcurrent in-rush timer expires prior to the measured current falling below the overcurrent threshold value, then the overcurrent protection component 325 may open the relays 515, 520 in order to de-energize the wire 102. The overcurrent protection component 325 may additional output an indication of the overcurrent event (e.g., an LED indication) and/or take any other suitable control actions.

Similarly, the overcurrent protection component 325 may identify excessive overcurrent events by comparing the measured current to an excessive overcurrent threshold value, such as a value of approximately 20 amps. If it is determined that the measured current exceeds the excessive overcurrent threshold value, then the overcurrent protection Component 325 may initiate an excessive overcurrent in-rush timer. As desired, a length of time associated with the expiration of the excessive overcurrent in-rush timer may be less than a length of time associated with the overcurrent in-rush timer. For example, an initial value of the excessive overcurrent in-rush timer may be less than an initial value of the overcurrent in-rush timer. Additionally, in certain embodiments, the initial value of the excessive overcurrent in-rush timer may be determined or set based upon the measured current value. For example, a lower initial value of the timer may be associated with a measured current of 20 amps than a measured current of 30 amps. In this regard, higher current will lead to relatively faster tripping of the relays 515, 520. A wide variety of initial values may be utilized as desired for the overcurrent in-rush timer and/or the excessive overcurrent in-rush timer. Additionally, the timer(s) may be either countdown timers or timers that count up to an established threshold.

If the value of the current falls below the excessive overcurrent threshold value (e.g., 20 amps) prior to expiration of the excessive overcurrent in-rush timer, then the overcurrent protection component 325 may determine that the excessive overcurrent event has been cleared. As desired, the overcurrent protection component 325 may then continue to monitor the current utilizing the overcurrent threshold value as described above. If, however, the excessive overcurrent in-rush timer expires prior to the measured current falling below the excessive overcurrent threshold value, then the overcurrent protection component 325 may open the relays 515, 520 in order to de-energize the wire 102. The overcurrent protection component 325 may additionally output an indication of the excessive overcurrent event (e.g., an LIED indication) and/or take any other suitable control actions.

Similar to the overcurrent protection component 325, the energy limiting component 320 may additionally receive measurements data from the Hot-Hi CT 525. The energy limiting component 320 may additionally be configured to receive voltage measurements associated with the electrical power signal supplied to the wire 102. For example, the energy limiting component 320 may monitor the voltage received from the line side. Based at least in part on received current measurements and received voltage measurements, the energy limiting component 320 may identify or detect wire faults or unsafe conditions associated with the wire 102.

In one example embodiment, the energy limiting component 320 may identify an excessive overcurrent event based upon a comparison of a measured voltage to an excessive overcurrent threshold (e.g., a threshold of approximately 20 amps). If the measured current exceeds the excessive overcurrent threshold, then the energy limiting component 320 may identify an excessive overcurrent event. The energy limiting component 320 may then determine whether a voltage droop occurs in conjunction with the identified excessive overcurrent event. For example, the energy limiting component 320 may compare one or more measured voltage values for a current half cycle associated with the electrical power signal to one or more corresponding stored voltage values, such as one or more stored voltage values associated with the immediately preceding half cycle. A determination may then be made based at least in part on the comparison as to whether a voltage droop has occurred.

In certain embodiments, a single measured voltage value associated with a current half cycle may be compared to a stored voltage value. In other embodiments, a plurality of voltage samples measured for the current half cycle (e.g. sixteen samples, thirty-two samples, etc.) may be compared to corresponding stored values. As desired, the absolute values of voltage measurements and/or stored samples may be utilized. In this regard, the sign associated with various half cycles of the alternating current electrical power signal may be ignored. Additionally, following the comparison, the measured voltage value(s) may be stored in place of the previously stored value(s). In this regard, the measured value(s) will be available for subsequent comparisons.

A wide variety of suitable techniques may be utilized as desired by the energy limiting component 320 to determine whether a voltage droop has occurred. For example, the comparison may facilitate a determination of whether a decrease in voltage exceeds a predetermined threshold condition. As one example, the energy limiting component 320 may determine whether a percentage decrease in voltage exceeds a predetermined percentage threshold. As another example, the energy limiting component 320 may determine whether an amplitude decrease in voltage exceeds a predetermined threshold. In embodiments that utilize a plurality of voltage samples, a determination may be made as to whether a voltage droop is associated with a predetermined number of the samples and/or whether a voltage droop is associated with a predetermined number of consecutive samples (e.g., three or more consecutive samples, etc.). In this regard, isolated outlier measurements that are likely inaccurate may be ignored.

the energy limiting component 320 determines that a voltage droop is associated with an identified excessive overcurrent event, then the energy limiting component 320 may identify an unsafe condition, and the energy limiting component 320 may open the relays 515, 520 in order to de-energize the wire 102. In this regard, the energy released by a wire fault (e.g., the energy released at a point of penetration, etc.) may be limited. For example, the energy released may be less than an amount associated with a predetermined energy threshold. A wide variety of different predetermined energy thresholds may be utilized as desired in various embodiments of the invention. Additionally, the energy limiting component 320 may output an indication of the identified event (e.g., an LED indication) and/or take any other suitable control actions. If, however, the energy limiting component 320 does not identify a voltage droop associated with the excessive overcurrent event, the energy limiting component 320 may continue to operate in conjunction with the overcurrent protection component 325 in order to monitor the wire 102 until either an in-rush timer expires or until the current on the wire 102 falls to an acceptable level. During the continued monitoring, the energy limiting component 320 may continue to evaluate the voltage associated with the electrical power signal and determine whether a voltage droop occurs in association with an excessive overcurrent event or an overcurrent event.

One example of the operations of the overcurrent protection component 325 and/or the energy limiting component 320 is described in greater detail below with reference to FIG. 10. Additionally, although the energy limiting component 320 is described as initially testing for voltage droops when an excessive overcurrent is identified, in certain embodiments, the energy limiting component 320 may initially test for voltage droops upon the identification of an overcurrent event.

In certain embodiments, the DWI component 340 of the ASD 500 may be configured to test the wire 102 for a short between the return conductor 512 and the ground conductor 513 following the identification of an excessive overcurrent in combination with a voltage droop. If it is determined by the DWI component 340 that no short is present, then it may be possible to determine that the excessive overcurrent event has been cleared, thereby allowing the wire 102 to be automatically electrified by the ASD 500 without user intervention.

In certain embodiments, if the ASD 500 trips in response to an overcurrent or an excessive overcurrent event, then a user may be required to manually reset the ASD 500. For example, a user may be required to depress a reset button associated with the ASD 500 for a sufficient period of time, such as three seconds, to reset the ASD 500. Following a reset, proactive tests may be performed as desired on the wire 102 and the wire 102 may be electrified if no faults are identified by the proactive tests. The wire 102 may then be reactively monitored and, if no excessive overcurrent events are immediately identified or identified within a threshold period of time (e.g., one minute, etc.), then a determination may be made that the cause of the triggering event likely results from a fault or short in a user load rather than in the monitored wire 102.

Additionally, in certain embodiments, the ASD 500 may utilize a special reset counter to track a number of times that the ASD 500 requires a user to reset the device. Once the special reset counter has reached a predetermined threshold value, the ASD 500 may enter a fatal alarm state, and the ASD 500 may be rendered unusable with the relays 515, 520 opened. A wide variety of different special reset counter threshold values may be utilized as desired in various embodiments of the invention. In certain embodiments, the threshold value may be established based on an expected lifetime of the relay contacts. In this regard, the special reset counter may be utilized to avoid situations in which a relay contact (e.g., a hot relay contact) becomes temporarily or permanently stuck as a result of damage to the contacts. Additionally, in certain embodiments, the threshold value may be established based on an expected lifetime of the hot relay 515. During operation of the ASD 500, the hot relay 515 may be turned on after the neutral relay 520 and turned off before the neutral relay 520, thereby subjecting the hot relay 515 to more abuse. Accordingly, as desired, different types of relays may be utilized for the hot relay 515 and the neutral relay 520. For example, a relatively more robust relay may be utilized for the hot relay 515 relative to the neutral relay 520.

Figure 6:
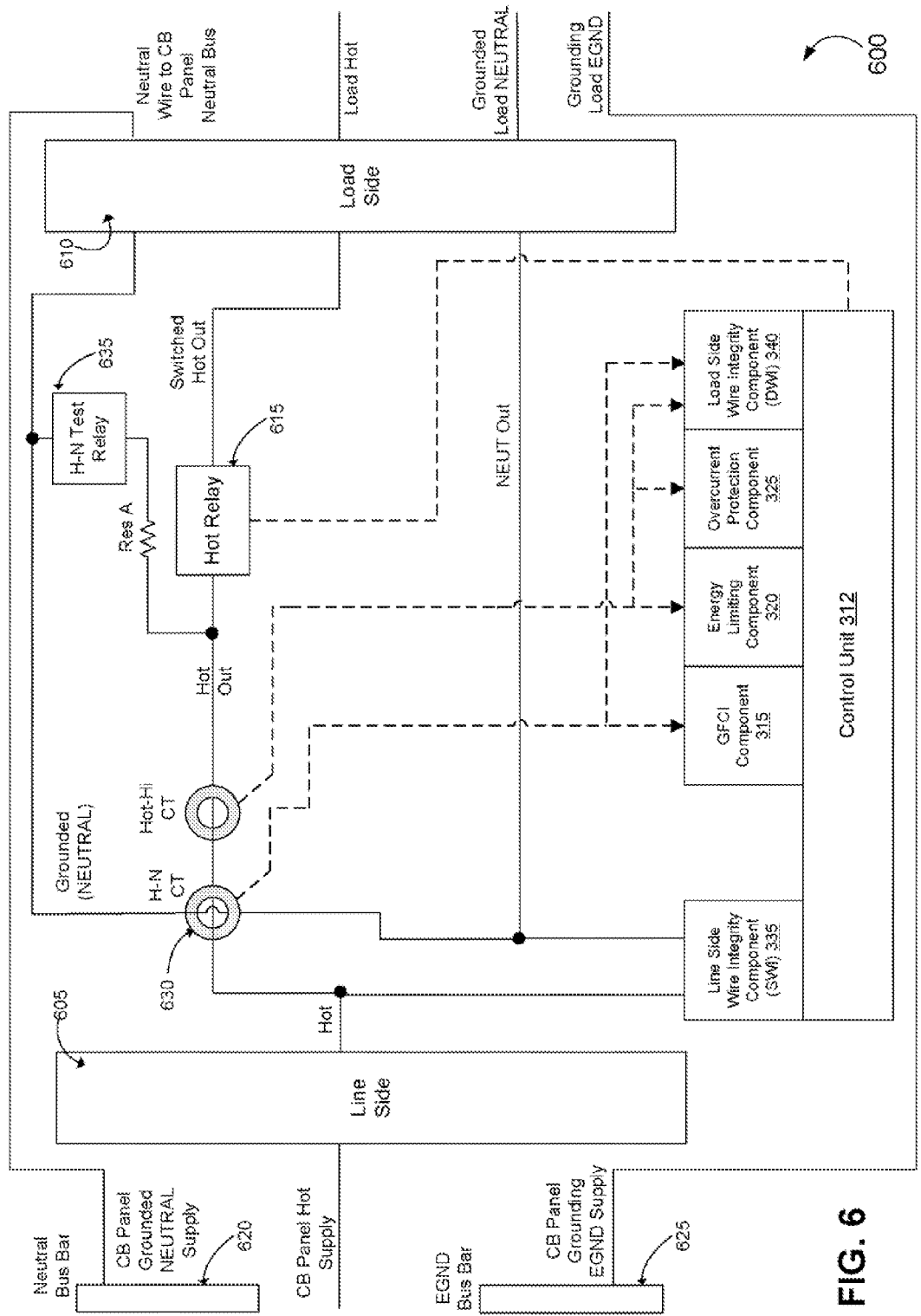
FIG. 6 is a schematic diagram of another example ASD, according to an embodiment of the invention.

FIG. 6 is a schematic diagram of another example ASD 600, according to an embodiment of the invention. The ASD 600 illustrated in FIG. 6 may be, for example, an ASD that is associated with a circuit breaker panel. For example, the ASD 600 may be integrated or incorporated into a circuit breaker component. Accordingly, the ASD 600 may include less components than those described above for the ASD 500 shown in FIG. 5. The components illustrated for the ASD 600 of FIG. 6 may be similar to those described above with reference to FIG. 5.

With reference to FIG. 6, the ASD 600 may be plugged directly into a circuit breaker panel. Accordingly, an electrical power signal or hot supply may be received from the circuit breaker panel at a line side 605 of the ASD 600. The electrical power signal may be carried through the ASD 600 and supplied through a load side interface 610 to an electrifiable conductor of a monitored wire 102. A suitable hot relay 615 may control the communication of the electrical power signal onto the electrifiable conductor of the monitored wire 102. Because the ASD 600 is plugged directly into the circuit breaker panel, a neutral supply and a ground supply from the circuit breaker panel may not be connected to the line side 605 of the ASD 600. However, the neutral supply may be connected to the load side 610 of the ASD 600. For example, a suitable spiral wound neutral wire may be utilized to connect the load side 610 of the ASD 600 to a neutral bus 620 of the circuit breaker panel. The neutral supply may then be routed through the H-N CT 630 to the neutral output of the ASD 600 for provision to the wire 102. Additionally, the neutral supply may be provided to the control unit 312 of the ASD 600 as a reference for the power supplied to the control unit 312.

The ground supply from the circuit breaker panel may be connected directly to the wire 102. For example, the wire 102 may be directly connected to a ground bus 625 associated with the ASD 600. Accordingly, the ASD 600 of FIG. 6 may not be configured to monitor the ground conductor of the wire 102. As a result, a Gnd CT and a ground current monitoring component may not be needed. The ASD 600, however, may be configured to perform a wide variety of other proactive and reactive monitoring of the wire 102. For example, the ASD 600 may include a GFCI component, an energy limiting component, an overcurrent protection component, and/or a DWI component that operate in a similar manner as that described above for the ASD 500 shown in FIG. 5.

In certain embodiments, one or more current limiting devices may additionally be included in the ASD 600 in association with the incoming hot power supply. For example, a suitable inductor may be situated between the hot input and the hot relay 615. As another example, a relatively small resistor (e.g., a resistor of less than approximately 100 milliohms) may be connected in parallel with a relay between the hot input and the hot relay 615. The current limiting devices may assist the energy limiting component 320 in the detection of a voltage droop. For example, during normal operation, the relay in parallel with the resistor may be closed. When an overcurrent event or excessive overcurrent is identified, the relay may be opened, thereby causing the hot power to flow through the resistor prior to being communicated onto the wire 102. As a result, it may be relatively easier to identify or detect a voltage droop.

Additionally, because the ASD 600 is connected directly to a circuit breaker panel, the SWI component 335 may not be configured to test the line side for miswires and/or open line side conductors. However, the SWI component 335 may still be configured to reactively monitor the received electrical power signal for abnormal voltage conditions (e.g., brownout conditions, blackout conditions, over voltage conditions, etc.).

Figure 7:
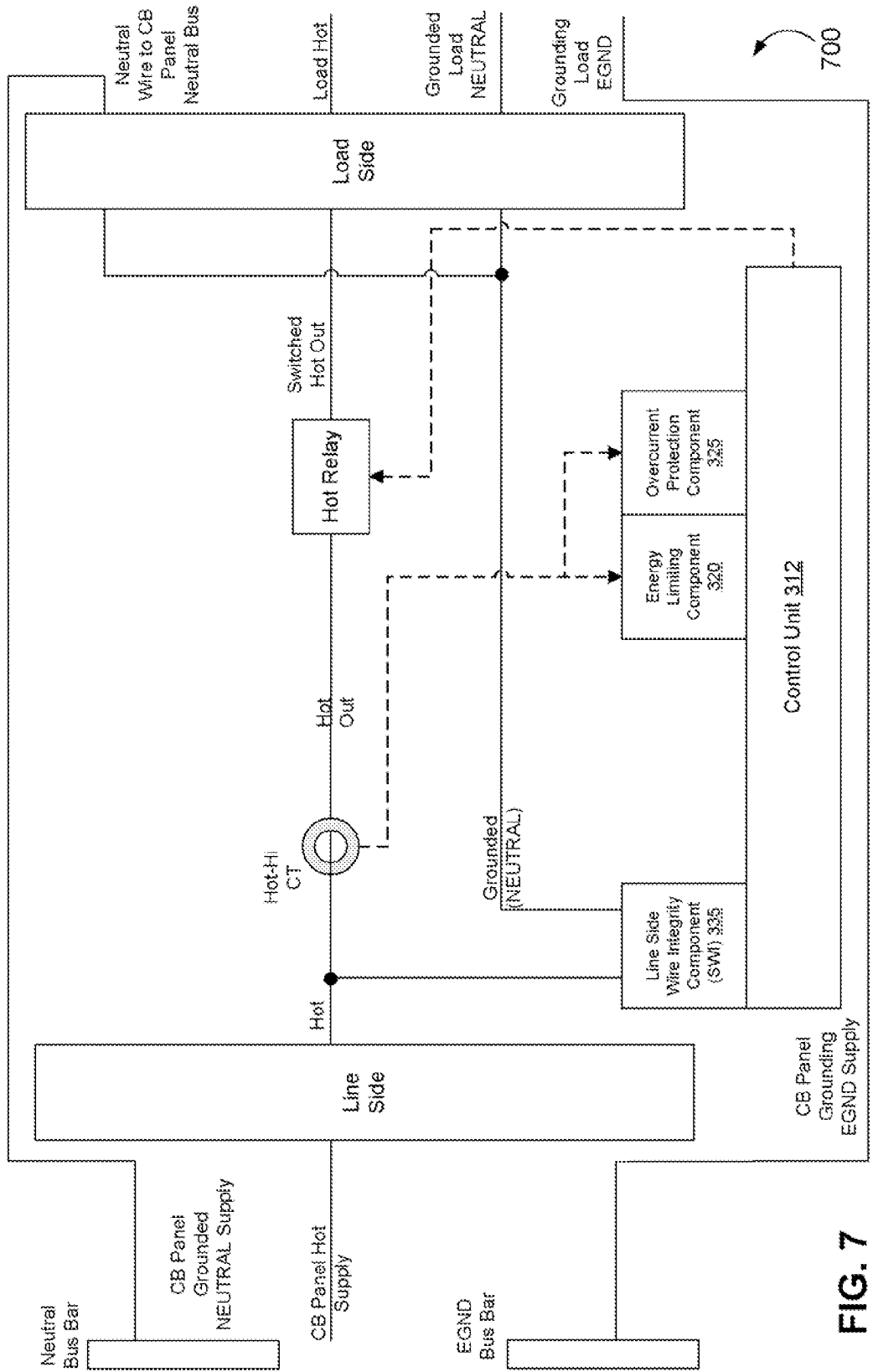
FIG. 7 is a schematic diagram of yet another example ASD, according to an embodiment of the invention.

FIG. 7 is a schematic diagram of yet another example ASD 700, according to an embodiment of the invention. The ASD 700 is similar to the ASD 600 described above with reference to FIG. 6 and may include similar components. As such, the ASD 700 may be integrated or incorporated into a circuit breaker panel.

The ASD 700 of FIG. 7 may include fewer components than the ASD 600 illustrated in FIG. 6. For example, the ASD 700 may not include a HN test relay or a H-N CT. Accordingly, the neutral power supply connected to the load side of the ASD 700 from the neutral bus of the circuit breaker panel may be provided directly to a neutral output of the ASD 700. The neutral power supply may also be utilized as a reference for the power provided to the control unit 312. Additionally, the ASD 700 may not include a GFCI component or a DWI component. However, the ASD 700 may include a SWI component that monitors the line side voltage of the ASD 700. Additionally, the ASD 700 may include a suitable energy limiting component and/or a suitable overcurrent protection component that monitors a connected wire 102 for overcurrent events and/or wire faults.

The ASDs 500, 600, 700 illustrated in FIGS. 5-7 are provided by way of example only. As desired, more or less than the components illustrated for the ASDs 500, 600, 700 may be utilized.

Figure 8A:
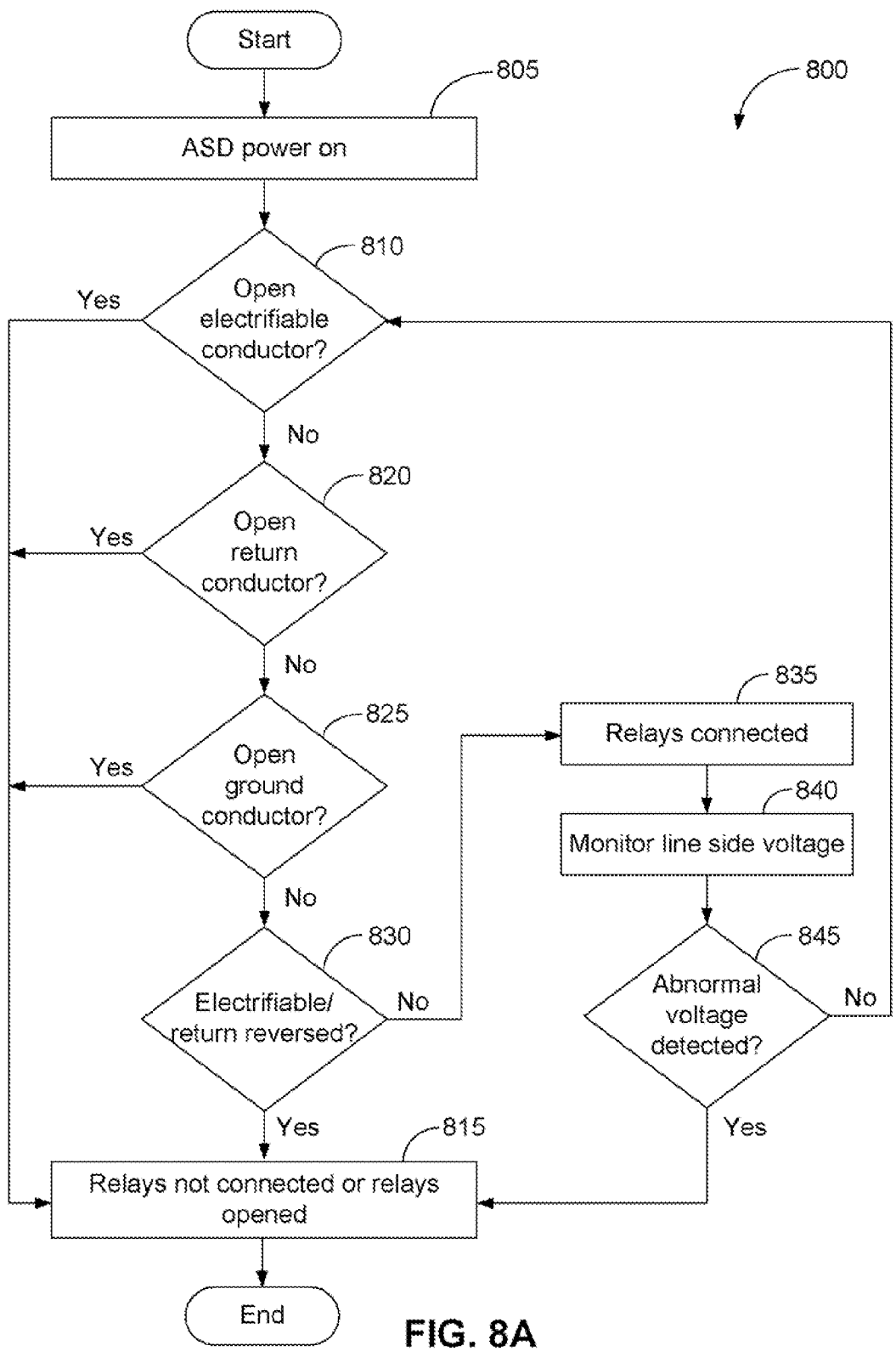
FIG. 8A is a flow diagram of one example method of the operations that may be performed by an ASD to monitor a line side of the ASD, according to an embodiment of the invention.

FIG. 8A is a flow diagram of one example method 800 of the operations that may be performed by an ASD to monitor a line side of the ASD, according to an embodiment of the invention. The operations of the method 800 may be performed by a wide variety of suitable ASDs, such as the ASD 500 illustrated in FIG. 5. In certain embodiments, the method 800 may be performed by a suitable SWI component 335 associated with the ASD 500. The method 800 may begin at block 805.

At block 805, power may be supplied to the ASD 500, and the ASD 500 may turn on. For example, the ASD 500 may receive power from a suitable line side power supply. Once power is supplied to the ASD 500, operations may continue at block 810. At block 810, the SWI component 335 may test the line side power source for an open electrifiable (or hot) conductor. For example, the SWI component 335 may include a suitable signal conditioning circuit that evaluates a power supply provided to a control unit 312 of the ASD 500. Based upon the evaluation, the SWI component 335 may identify an open electrifiable conductor. If an open electrifiable conductor is detected at block 810, then operations may continue at block 815, and the SWI component 335 may prevent the electrification of the wire 102 by maintaining one or more relays in an open position. If, however, an open electrifiable conductor is not detected at block 810, then operations may continue at block 820. At block 820, the SWI component 335 may test the line side power source for an open return (or neutral) conductor. For example, the SWI component 335 may include a suitable signal conditioning circuit that evaluates a power supply provided to a control unit 312 of the ASD 500. Based upon the evaluation, the SWI component 335 may identify an open return conductor. If an open return conductor is detected at block 820, then operations may continue at block 815, and the SWI component 335 may prevent the electrification of the wire 102 by maintaining one or more relays in an open position. If, however, an open return conductor is not detected at block 820, then operations may continue at block 825.

At block 825, the SWI component 335 may test the line side power source for an open ground (or grounding) conductor. For example, the SWI component 335 may proactively detect an open ground conductor by detecting a ground voltage that exceeds an open ground threshold value, such as a voltage resulting from a hot output of the ASD 500 flowing through a ground bias resistor. If an open ground conductor is detected at block 825, then operations may continue at block 815, and the SWI component 335 may prevent the electrification of the wire 102 by maintaining one or more relays in an open position. If, however, an open ground conductor is not detected at block 825, then operations may continue at block 830.

Once the relays have been closed and the wire is electrified, the ASD 500 may reactively identify an open ground conductor. For example, as explained in greater detail above with reference to FIG. 5, the SWI component 335 may identify an open ground conductor based upon a relatively low current detected by a ground CT. The relatively low current may be caused by an interruption of current flowing from a hot output of the ASD 500 through a ground bias resistor and through the ground CT. If an open ground conductor is reactively identified, then operations may continue at block 815, and the SWI component 335 may open the one or more relays, thereby causing the wire 102 to be de-energized.

At block 830, the SWI component 335 may determine whether the electrifiable conductor and the return conductor have been reversed on the line side. For example, the SWI component 335 and/or an associated signal conditioning circuit may analyze a power signal supplied to the control unit 312 of the ASD 500. Based upon the analysis, a determination may be made as to whether the electrifiable and return conductors have been reversed. If it is determined at block 830 that the electrifiable conductor and the return conductor have been reversed on the line side, then operations may continue at block 815, and the SWI component 335 may prevent the electrification of the wire 102 by maintaining one or more relays in an open position. If however, it is determined at block 830 that the electrifiable conductor and the return conductor have not been reversed on the line side, then operations may continue at block 835.

At block 835, the one or more relays (e.g., the hot relay and the neutral relay) of the ASD 500 may be closed or connected, and the wire 102 may be electrified. Operations may then continue at block 840, and the SWI component 335 may monitor the voltage of the electrical power signal received at the line side. At block 845, the SWI component 335 may determine whether an abnormal voltage is detected. For example, the SWI component 335 may detect a blackout condition or an over voltage condition. If an abnormal voltage is detected at block 845, then operations may continue at block 815, and the SWI component 335 may open the one or more relays to de-energize the wire 102. If, however, an abnormal voltage is not detected at block 845, then operations may continue at block 810, and the line side may be reactively monitored for one or more open conductors. Accordingly, the SWI component 335 may reactively monitor the line side for open conductors and/or abnormal voltage conditions.

The method 800 may end following block 815.

The tests performed by the SWI component 335 do not necessarily have to be performed in the order set forth in the logic of FIG. 8A, but instead may be performed in any suitable order. Additionally, in certain embodiments of the invention, the SWI component 335 does not have to conduct each test set forth in FIG. 6, but instead may conduct less than all of the tests set forth in FIG. 6. If any test results in the execution of the operations at block 815, then the SWI component 335 may output an indication of an identified fault. For example, a suitable LED indicator may be activated by the SWI component 335.

Figure 8B:
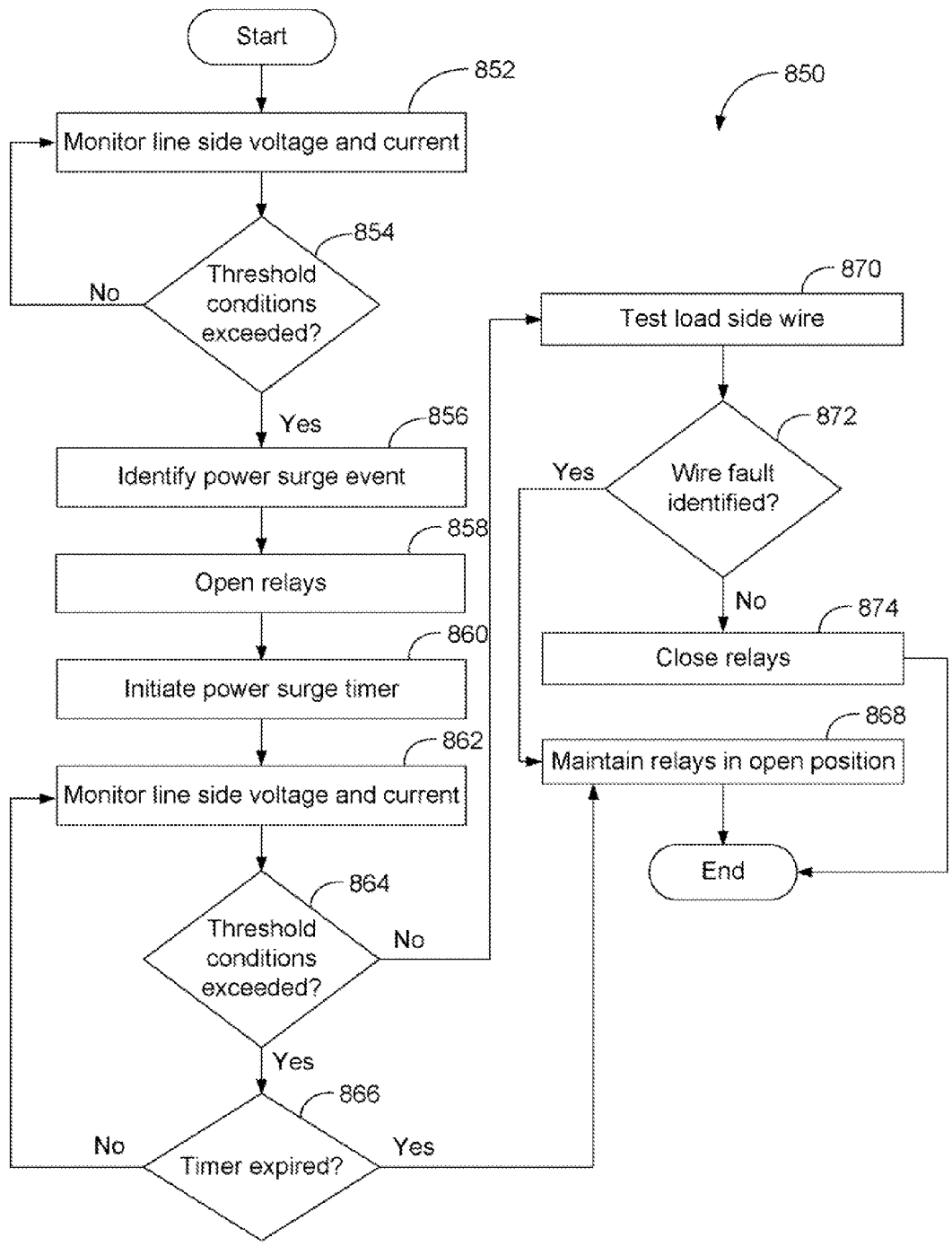
FIG. 8B is a flow diagram of one example method of the operations that may be performed by an ASD following the identification of a line side power surge event, according to an embodiment of the invention.

FIG. 8B is a flow diagram of one example method 850 of the operations that may be performed by an ASD following the identification of a line side power surge event, according to an embodiment of the invention. The operations of the method 850 may be performed by a wide variety of suitable ASDs, such as the ASD 500 illustrated in FIG. 5. In certain embodiments, the method 850 may be performed by a suitable SWI component 335 associated with the ASD 500. Additionally, the method 850 may be utilized to monitor a line side following the electrification of a load side wire. The method 850 may begin at block 852.

At block 852, the ASD 500 may monitor the voltage and/or current of the electrical power signal received at the line side. For example, one or more suitable current sensing and/or voltage sensing devices may be utilized to monitor a current and/or voltage associated with a received line side power signal. At block 854, the ASD 500 may determine whether a monitored voltage and/or current exceed one or more threshold conditions associated with a power surge event, such as a lightning strike event. For example, the ASD 500 may determine whether a monitored or measured voltage exceeds a voltage threshold and/or whether a monitored or measured current exceeds a current threshold). A wide variety of different threshold values may be utilized as desired in various embodiments of the invention. If it is determined at block 854 that the one or more threshold conditions have not been exceeded, then operations may continue at block 852, and the ASD 500 may continue to monitor the line side. If, however, it is determined at block 854 that the one or more threshold conditions have been exceeded, then operations may continue at block 856, and a power surge event may be identified.

Once a power surge event has been identified at block 856, operation may continue at block 858, and the ASD 500 may open the one or more relays to discontinue the provision of the electrical power signal to the load side wire. At block 860, which may be optional in certain embodiments of the invention, a power surge timer, such as a countdown or count-up timer, may be initiated. Additionally, at block 862, the ASD 500 may monitor the line side voltage and/or current in order to determine whether the power surge event has been cleared, thereby permitting the re-electrification of the load side wire.

At block 864, a determination may be made as to whether the threshold line side conditions (e.g., threshold current and/or voltage conditions) are exceeded by the monitored line side power signal. If it is determined at block 864 that the threshold conditions are not longer exceeded, then operations may continue at block 870 described in greater detail below. If, however, it is determined at block 864 that the threshold conditions are exceeded, then operations may continue at block 866. At block 866, a determination may be made as to whether the power surge timer has expired or reached a threshold condition. If it is determined at block 866 that the timer has not expired or reached a threshold condition, then operations may continue at block 862, and the line side voltage and/or current may continue to be monitored. If, however, it is determined at block 866 that the timer has expired or reached a threshold condition, then operations may continue at block 868, and the relays may be maintained in an open position. In this regard, a manual reset of the ASD 500 may be required to re-energize the load side wire. Alternatively, the ASD 500 may proactively retest the line side and/or load side at a subsequent point in time. As desired, a wide variety of different initial counter values and/or counter threshold conditions may be utilized, such as an initial counter value of approximately 20-30 half cycles for the electrical power signal.

At block 870, which may be optional in certain embodiments of the invention, the ASD 500 may proactively test the load side wire. In this regard, the ASD 500 may determine whether an wire faults or other unsafe conditions are present on the wire prior to re-energizing the wire. For example, the wire may be tested for damage caused by the prior power surge event. A wide variety of suitable methods and/or techniques may be utilized as desired to proactively test the load side wire, such as the techniques described below with reference to FIG. 9. At block 872, a determination may be made as to whether a wire fault or other unsafe condition is identified or detected on the load side wire. If a wire fault is identified at block 872, then operations may continue at block 868, and the relays may be maintained in an open position. If, however, no wire faults or unsafe conditions are identified at block 872, then operations may continue at block 874. At block 874, a determination may be made that it is safe to re-energize the load side wire, and the relays may be closed. In this regard, the ASD 500 may facilitate testing of the line side and/or load side following an identified power surge event, and the load side wire may be automatically re-energized once the power surge event has been cleared.

The method 850 may end following either block 868 or 874.

The operations performed by the ASD 500 with reference to FIG. 8B do not necessarily have to be performed in the order set forth in the logic of FIG. 8B, but instead may be performed in any suitable order. Additionally, more or less than the operations described in FIG. 8B may be performed.

Figure 9:
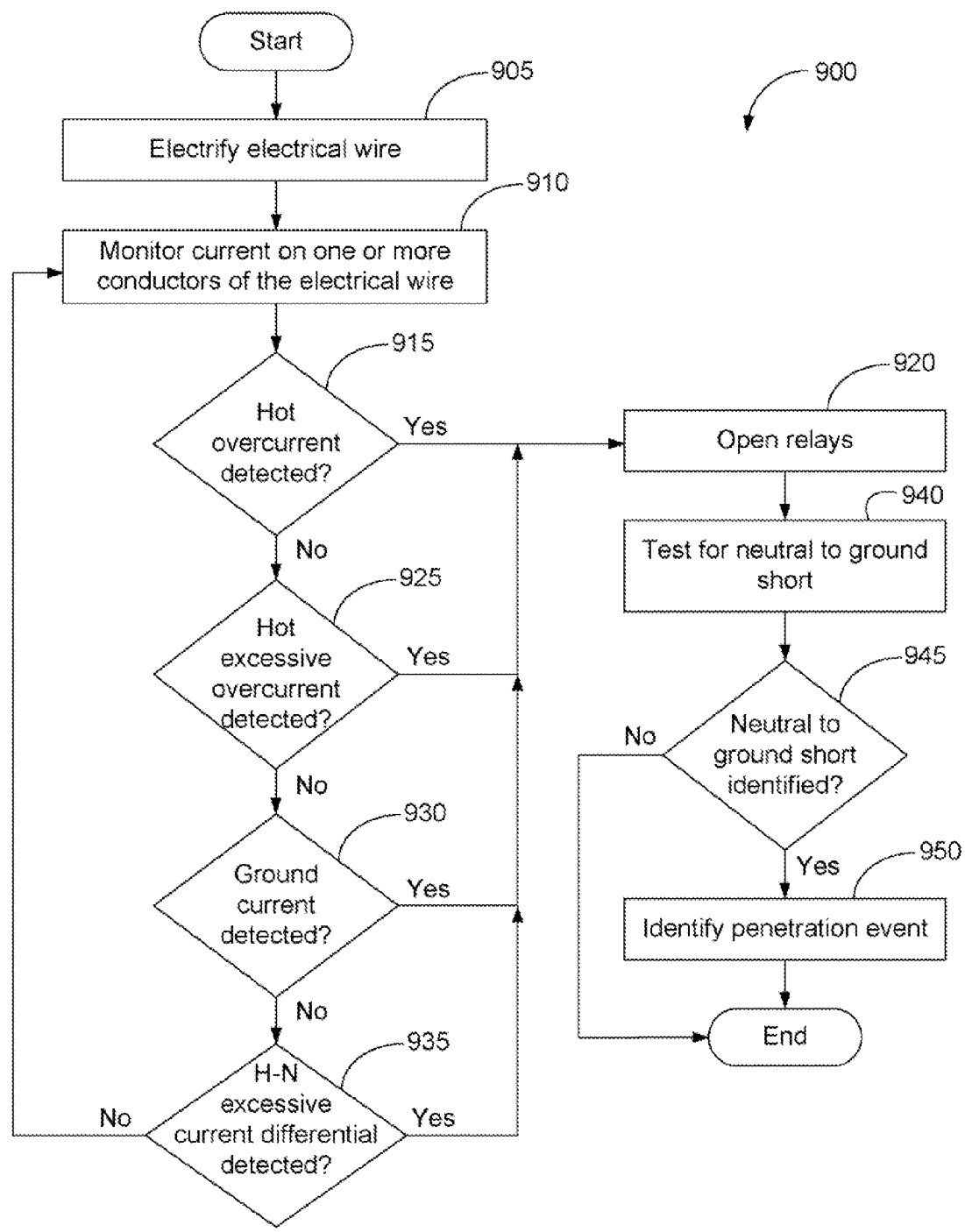
FIG. 9 is a flow diagram of one example method of the operations that may be performed by an ASD to monitor a load side of the ASD, according to an embodiment of the invention.

FIG. 9 is a flow diagram of one example method 900 of the operations that may be performed by an ASD to reactively monitor a load side of the ASD, according to an embodiment of the invention. The operations of the method 900 may be performed by a wide variety of suitable ASDs, such as the ASD 500 illustrated in FIG. 5. The method 900 may begin at block 905.

At block 905, an electrical wire, such as wire 102, may be electrified. For example, one or more relays (e.g., a hot relay and a neutral relay) associated with the ASD 500 may be closed, thereby permitting an electrical power signal to be communicated onto the wire 102. At block 910, the current present on one or more conductors of the wire 102 may be monitored. For example, one or more suitable current transformers or other current sensing devices may be utilized to measure one or more currents associated with the wire 102, such as a current on an electrifiable conductor of the wire 102, a current differential between the electrifiable conductor and a neutral conductor of the wire 102, and/or a current on a ground conductor of the wire 102. The current measurements may be utilized by one or more safety components of the ASD in order to identify a wide variety of different wire faults and/or unsafe conditions.

At block 915, a determination may be made as to whether a hot overcurrent is detected. For example, a measured current on the electrifiable conductor may be compared to an overcurrent threshold value (e.g., a threshold value of approximately 15 amps). Similarly, at block 925, a determination may be made as to whether an excessive overcurrent is detected. For example, the measured current on the electrifiable conductor may be compared to an excessive overcurrent threshold value (e.g., a threshold value of approximately 20 amps). In conjunction with an identified overcurrent or an excessive overcurrent, one or more in-rush timers may be utilized in order to determine whether the overcurrent or excessive overcurrent clears within a sufficient time period. Additionally, a voltage associated with the electrical power signal may be monitored in order to determine whether a voltage droop occurs. In this regard, a determination may be made as to whether an overcurrent event or excessive overcurrent event is detected. One example of the operations that may be utilized to identify overcurrent events and/or excessive overcurrent events is described in greater detail below with reference to FIG. 10. If an overcurrent event is detected at block 915 or if an excessive overcurrent event is detected at block 925, then operations may continue at block 920. At block 920, the relays associated with the ASD 500 may be opened in order to de-energize the wire 102. If, however, no overcurrent or excessive overcurrent event is detected at block 915 or block 925, then operations may continue at block 930.

At block 930, a determination may be made as to whether a ground current is detected. For example, a suitable ground current monitoring component may receive measurements data from a ground CT or other ground current sensing device. If a ground current is detected at block 930, then operations may continue at block 920, and the relays may be opened. If, however, a ground current is not detected at block 930, then operations may continue at block 935. At block 935, a determination may be made as to whether a ground fault is detected on the wire 102. For example, a determination may be made as to whether a current differential between the electrifiable and return conductors exceeds a differential threshold value. If a ground fault is detected at block 935, then operations may continue at block 920, and the relays may be opened. If however, a ground fault is not detected at block 935, then operations may continue at block 910, and monitoring of the wire 102 may continue.

In certain embodiments of the invention, once the relays have been opened at block 920, the ASD 500 may determine whether a penetration event has likely occurred. For example, following block 920, operations may continue at block 940. At block 940, the wire 102 may be tested for a short between a return or neutral conductor and a ground conductor. For example, as explained in greater detail above with reference to FIG. 5, a test signal may be communicated onto the wire 102, and the wire 102 may be monitored for indications of a short. A determination may be made at block 945 as to whether a neutral to ground short is identified. If a short is identified at block 945, then operations may continue at block 950, and a likely penetration event or wire fault may be identified. Operations may then end. If, however, a short is not identified at block 945, then operations may end and, as desired, the ASD 500 may automatically be reset without user interaction.

The method 900 may end following either block 945 or block 950.

Figure 10:
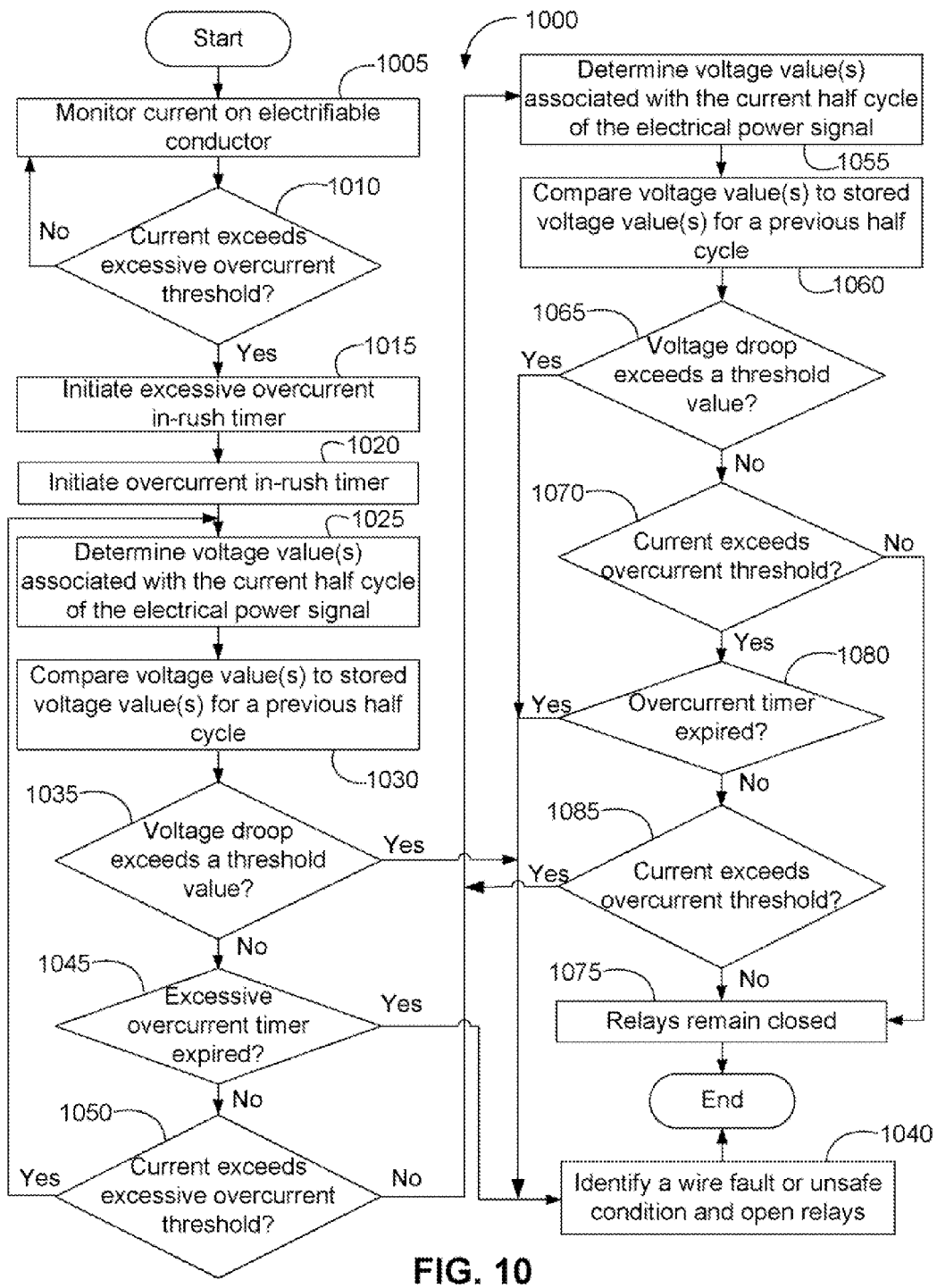
FIG. 10 is a flow diagram of one example method of the operations that may be performed by an ASD to detect wire faults and/or other unsafe conditions on a load side of the ASD, according to an embodiment of the invention.

FIG. 10 is a flow diagram of one example method 1000 of the operations that may be performed by an ASD to detect wire faults and/or unsafe conditions on a load side of the ASD, according to an embodiment of the invention. The method 1000 illustrates one example of the operations that may be performed at blocks 915 and 925 of FIG. 9. As such the operations of the method 1000 may be performed by a suitable overcurrent protection component and/or a suitable energy limiting component, such as the overcurrent protection component 325 and/or energy limiting component 320 illustrated in FIG. 5.

At block 1005, the current on an electrifiable or hot conductor of a load side wire 102 may be monitored. For example, a value of the current may be measured by a suitable current transformer or other suitable current sensing device, and the measurement values may be provided to a suitable control unit 312 associated with the ASD 500. At block 1010, a determination may be made as to whether the hot current exceeds an excessive overcurrent threshold. Additionally or alternatively, a determination may be made as to whether the hot current exceeds an overcurrent threshold. A wide variety of different excessive overcurrent and/or overcurrent thresholds may be utilized as desired in various embodiments of the invention. For example, an excessive overcurrent threshold value of 20 amps (or 10 amps with a 240V AC application) and an overcurrent threshold of 15 amps (or 6-7 amps with a 240V AC application) may be utilized, If it is determined at block 1010 that an excessive overcurrent threshold (or an overcurrent threshold) has not been exceeded, then operations may continue at block 1005 described above. If however, it is determined at block 1010 that an excessive overcurrent threshold (or an overcurrent threshold) has been exceeded, then operations may continue at block 1015.

At block 1015, an excessive overcurrent in-rush timer may be initiated. The excessive overcurrent in-rush timer may be utilized in order to determine whether a detected excessive overcurrent is cleared within a sufficient period of time. In other words, the excessive overcurrent in-rush timer may be utilized in order to determine whether a detected excessive overcurrent is likely associated with user loads connected to the wire 102. A wide variety of initial values may be associated with the excessive overcurrent in-rush timer as desired in various embodiments. Additionally, in certain embodiment, the initial value may be set based upon a measured value of the current. At block 1020, an overcurrent in-rush timer may be initiated. The overcurrent in-rush timer may be similar to the excessive overcurrent in-rush timer; however, the overcurrent in-rush timer may be associated with a longer time period relative to the excessive overcurrent in-rush timer. The overcurrent in-rush timer may be utilized in order to determine whether a detected overcurrent is cleared within a sufficient time period.

At block 1025, one or more voltage values associated with the electrical power signal may be measured and/or determined. In certain embodiments, the one or more voltage values may be values taken within a current half cycle of the electrical power signal. Any number of voltage values or voltage samples may be taken as desired in various embodiments of the invention. At block 1030, the one or more measured voltage values may be compared to one or more corresponding stored voltage values, such as stored voltage values associated with the previous half cycle. As desired, the absolute values of the various voltage measurements and stored values may be utilized in order to account for sign differences between successive half cycles.

At block 1035, a determination may be made as to whether a voltage droop from the previous half cycle to the current half cycle exceeds a threshold voltage value. For example, a determination may be made as to whether a percentage drop in the voltage exceeds a threshold percentage value. As desired, multiple voltage samples and/or comparisons may be evaluated when making the determination. For example, a determination may be made as to whether a series of successive voltage samples have a sufficient voltage droop relative to the stored samples. If it is determined at block 1035 that a voltage droop exceeds a threshold value, then operations may continue at block 1040. At block 1040, an unsafe condition (e.g., a penetration event, other wire fault event, etc.) may be identified, and the relays of the ASD 500 may be opened in order to de-energize the wire 102. If, however, it is determined at block 1035 that no voltage droop exists or that a voltage droop does not exceed a threshold value, then operations may continue at block 1045.

At block 1045, a determination may be made as to whether the excessive overcurrent in-rush timer has expired. If it is determined at block 1045 that the excessive overcurrent in-rush timer has expired, then operations may continue at block 1040, and the relays of the ASD 500 may be opened. If, however, it is determined at block 1045 that the excessive overcurrent in-rush timer has not expired, then operations may continue at block 1050. At block 1050, a determination may be made as to whether the measured current on the hot conductor exceeds the excessive overcurrent threshold. The determination made at block 1050 may be similar to that described above with reference to block 1010. If it is determined at block 1050 that the current exceeds the excessive overcurrent threshold, then operations may continue at block 1025 as described above. In this regard, the current may be monitored in conjunction with the excessive overcurrent in-rush timer in order to determine whether the excessive overcurrent falls to an acceptable level.

If, however, it is determined at block 1050 that the current does not exceed the excessive overcurrent threshold (e.g., the current has fallen below the excessive overcurrent threshold value), then operations may continue at block 1055. At block 1055, one or more voltage values associated with the current half cycle of the electrical power signal may be determined in a similar manner as that described above with reference to block 1025. At block 1060, the one or more determined values may be compared to one or more stored values in a similar manner as that described above with reference to block 1030. At block 1065, a determination may be made as to whether a voltage droop between a current half cycle and a preceding half cycle exceeds a threshold, such as a threshold percentage value. The determination at block 1065 may be similar to that described above with reference to block 1035.

If it is determined at block 1065 that the voltage droop exceeds a threshold value, then operations may continue at block 1040, and the relays of the ASD 500 may be opened in order to de-energize the wire 102. If, however, it is determined at block 1065 that no voltage droop has occurred or that a voltage droop does not exceed a threshold value, then operations may continue at block 1070.

At block 1070, a determination may be made as to whether a measured current on the hot conductor of the wire 102 exceeds the overcurrent threshold (e.g., a 15 amp threshold). If it is determined at block 1070 that the measured current does not exceed the overcurrent threshold, then a determination may be made that the overcurrent event has been cleared, and operations may continue at block 1075. At block 1075, the relays may be permitted to remain closed. If, however, it is determined at block 1070 that the measured current exceeds the overcurrent threshold, then operations may continue at block 1080.

At block 1080, a determination may be made as to whether the overcurrent in-rush timer has expired. If it is determined at block 1080 that the overcurrent in-rush timer has expired, then operations may continue at block 1040, and the relays of the ASD 500 may be opened. If, however, it is determined at block 1080 that the overcurrent in-rush timer has, not expired, then operations may continue at block 1085. At block 1085, a determination may be made as to whether the measured current on the hot conductor exceeds the overcurrent threshold. The determination made at block 1085 may be similar to that described above with reference to block 1070. If it is determined at block 1085 that the current exceeds the overcurrent threshold, then operations may continue at block 1055 described above. In this regard, the current may be monitored in conjunction with the overcurrent in-rush tinier in order to determine whether the current falls to an acceptable level.

If, however, it is determined at block 1085 that the current does not exceed the overcurrent threshold (e.g., the current has fallen below the overcurrent threshold value), then operations may continue at block 1075, and the relays may be permitted to remain closed.

The method 1000 may end following either block 1040 or block 1075.

As desired in various embodiments of the invention, a voltage droop may be identified or detected in conjunction with an overcurrent event (e.g., a current between approximately 15 amps and approximately 20 amps) or an excessive overcurrent event (e.g., a current greater than approximately 20 amps). Accordingly, any number of in-rush timers may be utilized as desired in various embodiments. The terms overcurrent event and excessive overcurrent event are provided to assist in understanding of the invention. As desired, the term overcurrent event may be utilized to refer to both an overcurrent event and an excessive overcurrent event.

The operations described and shown in the methods 900 and 1000 of FIGS. 9-10 may be carried out or performed in any suitable order as desired in various embodiments of the invention. Additionally, in certain embodiments, at least a portion of the operations may be carried out in parallel. Furthermore, in certain embodiments, less than or more than the operations described in FIGS. 9-10) may be performed.

Figure 11:
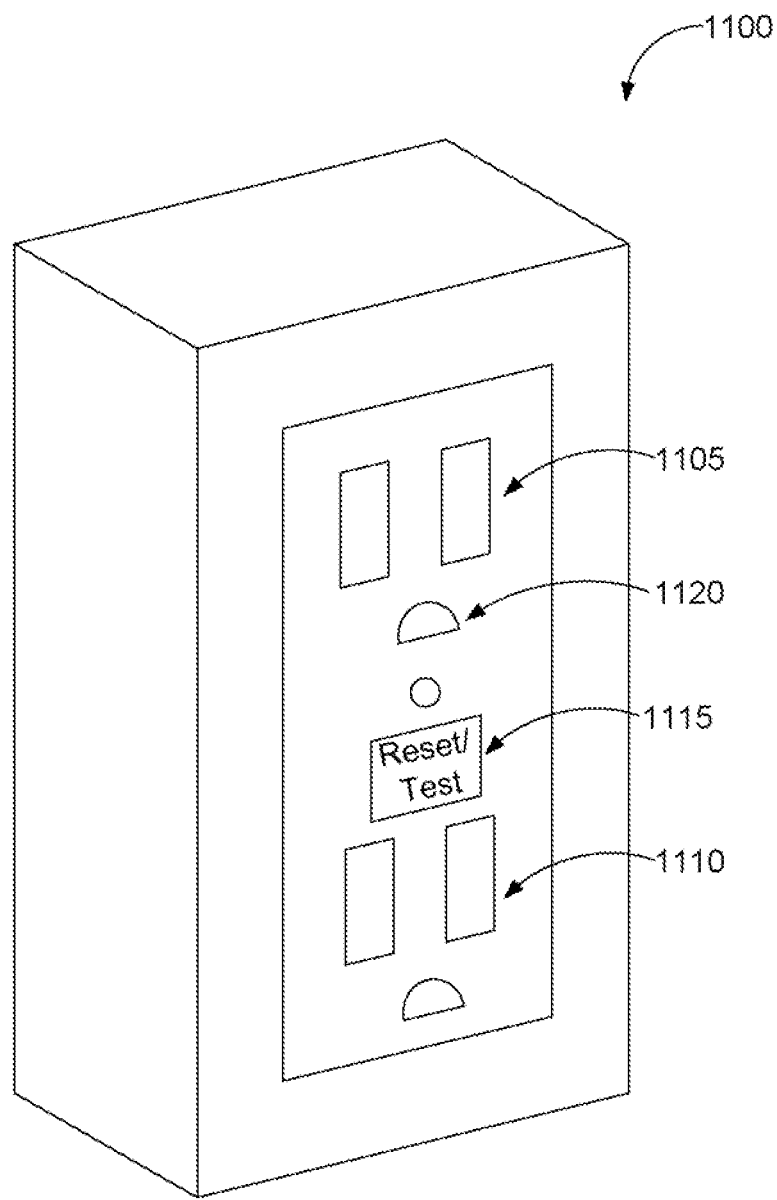
FIG. 11 is a schematic diagram of one example of a source device that may be incorporated into an electrical outlet, according to an illustrative embodiment of the invention.

FIG. 11 is a schematic diagram of one example of a source device 1100 that may be incorporated into or integrated with an electrical outlet. The source device 1100 may include a suitable ASD, such as the ASD 500 described above with reference to FIG. 5. Additionally, as desired, the source device 1100 may be situated within or on a wall or other surface in place of an electrical outlet. An electrical power signal may be received on a line side of the source device 1100, and the ASD 500 may monitor a wire connected on a load side and/or a wide variety of user loads that may be plugged into one or more suitable electrical outlets 1105, 1110 associated with the source device 1100.

The source device 1100 may include any number of electrical outlets or sockets 1105, 1110 that permit standard electrical plugs to be plugged into the source device 1100. Additionally, the source device 1100 may include any number of buttons 1115 that may be depressed by a user in order to reset the ASD 500 and/or to test the ASD 500. Finally, in certain embodiments, the source device 1100 may include any number of LEDs 1120 or other suitable indicators that facilitate the presentation of information to a user. For example, one or more bi-color LEDs may be utilized to flash various codes associated with different event types or fault conditions identified by the ASD 500.

Figure 12:
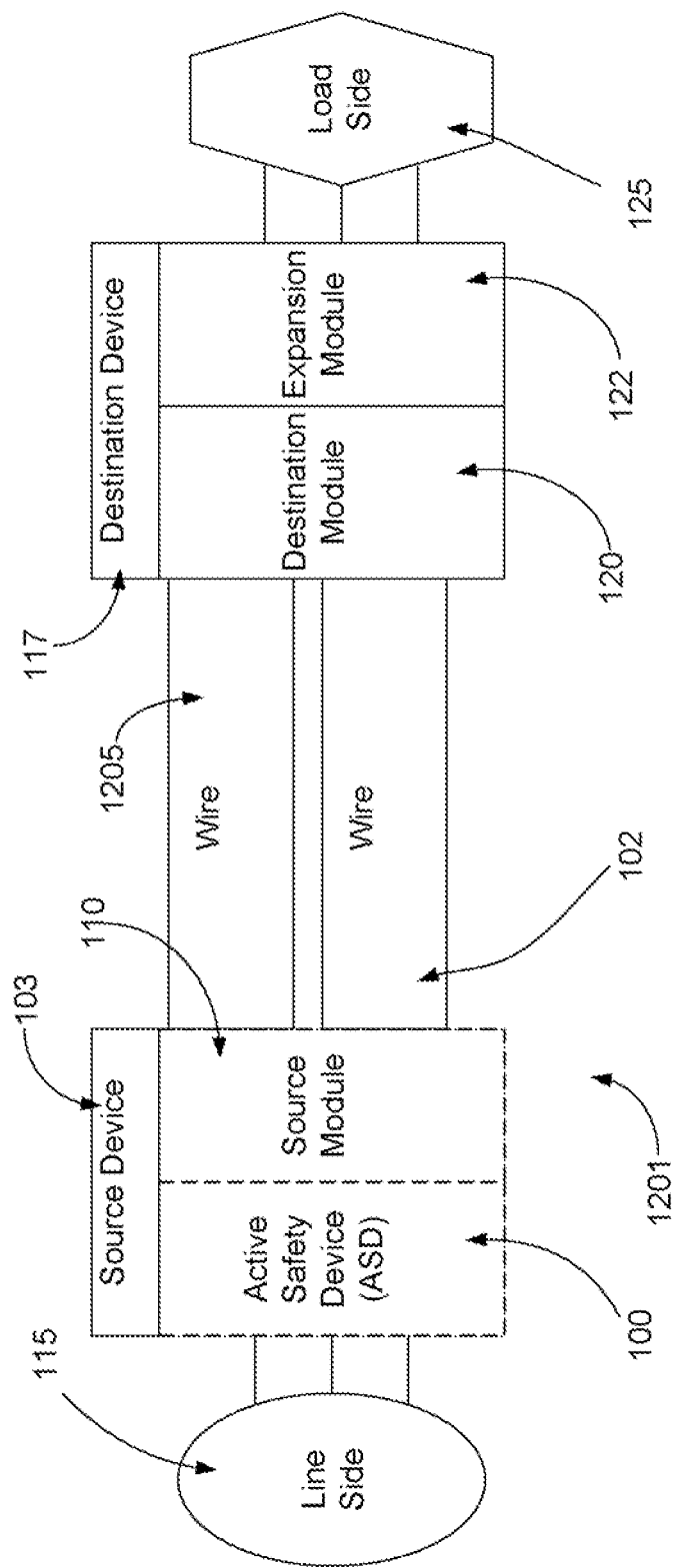
FIG. 12 is a schematic diagram of a wire system including an ASD that monitors two wires connected to the same destination device, according to an illustrative embodiment of the invention.

According to another aspect of the invention, an ASD, such as the ASD 100 illustrated in FIG. 1, may be capable of supporting and monitoring more than one wire. Multiple wires 102 may extend from the ASD 100 to separate destination devices 117 or separate loads 125. Alternatively or additionally, more than one wire 102 may be disposed between the ASD 100 and a destination device 117 or load 125, as shown in FIG. 12. With reference to FIG. 12, the ASD 100 may monitor two wires 102, 1205 connected to the same destination or load. For example, both a primary wire 102 and a secondary wire 1205 may extend from the ASD 100 to a destination or load. If the ASD 100 detects a wire fault or unsafe condition in the primary wire 102, then the ASD 100 may open one or more relays associated with the primary wire 102, thereby preventing electrification of the primary wire 102. The ASD 100 may then close one or more relays connected to the secondary wire 1205 and allow electrification of the secondary wire 1205 in order to power the load 125. The secondary wire 1205 may be monitored by the ASD 100 in the same manner as the primary wire 102. Additionally, the control unit 312 of the ASD 100 or, alternatively, a safety component of the ASD 100, may provide to a user an indication of the change to the secondary wire 1205. This indication may be any suitable control action, such as activating an LED indicative of the change to the secondary wire 1205. Another control action that may be taken is the transmission of a message by the ASD 100 indicating the change to the secondary flat wire 1205. The message may be transmitted to another ASD 100, to a central hub or control panel, or to another destination, as will be explained in greater detail below.

According to another aspect of the invention, a source device, such as the source device 103 illustrated in FIG. 1, may be used in conjunction with more than one destination device connected in series. FIG. 13 is a schematic diagram of multiple destination devices 117*a-n* in a serial configuration being supported by a single source device 103. As shown in FIG. 13, a single source device 103 containing an ASD 100 may monitor a wire 102 that runs from the source device 103 to a series of destination devices 117*a-n*. Each of the destination devices 117*a-n* may be an electrical load such as an outlet assembly or receptacle. This type of configuration may also be referred to as an add-a-receptacle configuration or as a daisy chain configuration.

An input segment of the wire 102 may be terminated at each destination device 117*a-n*, and a new output segment of wire 102 may be used to connect the next destination device 117*a-n*. For example, a first segment of wire 102 may connect the source module 110 to the destination module 120 of the first destination device 117*a*, where the first segment of wire 102 is terminated. A separate segment of wire 102 may then connect the first destination device 117*a* to the second destination device 117*b*. This pattern may continue until the wire 102 reaches the last destination device 117*n*. Alternatively, a single segment of wire 102 may be used to connect all of the destination devices 117*a-n*.

In certain embodiments, each destination device 117*a-n* may include a relay in communication with and controlled by the ASD 100 for passing the signal carried by the wire 102 on to the next destination device 117*a-n*. For example, the first destination device 117*a* may include one or more relays that pass the electrical power and/or signals carried by the wire 102 on to the second destination device 117*b*. The electrical power may be relayed through each destination device 117*a-n* until the wire 102 reaches the last destination device 117*n*, at which point no relay is necessary. Optionally, each destination device 117 may include an ASD 100 or components of an ASD 100 that facilitate testing and/or monitoring the wire 102 extending from the destination device 117 to the next downstream destination device. Accordingly, each destination device 117 may identify downstream wire faults and/or unsafe conditions, thereby permitting faults to be isolated. As an alternative to relays, each destination module 117*a-n* may include a control unit or other control logic that is in communication with the ASD 100, and that is used to isolate a fault in the wire 102.

Figure 14:
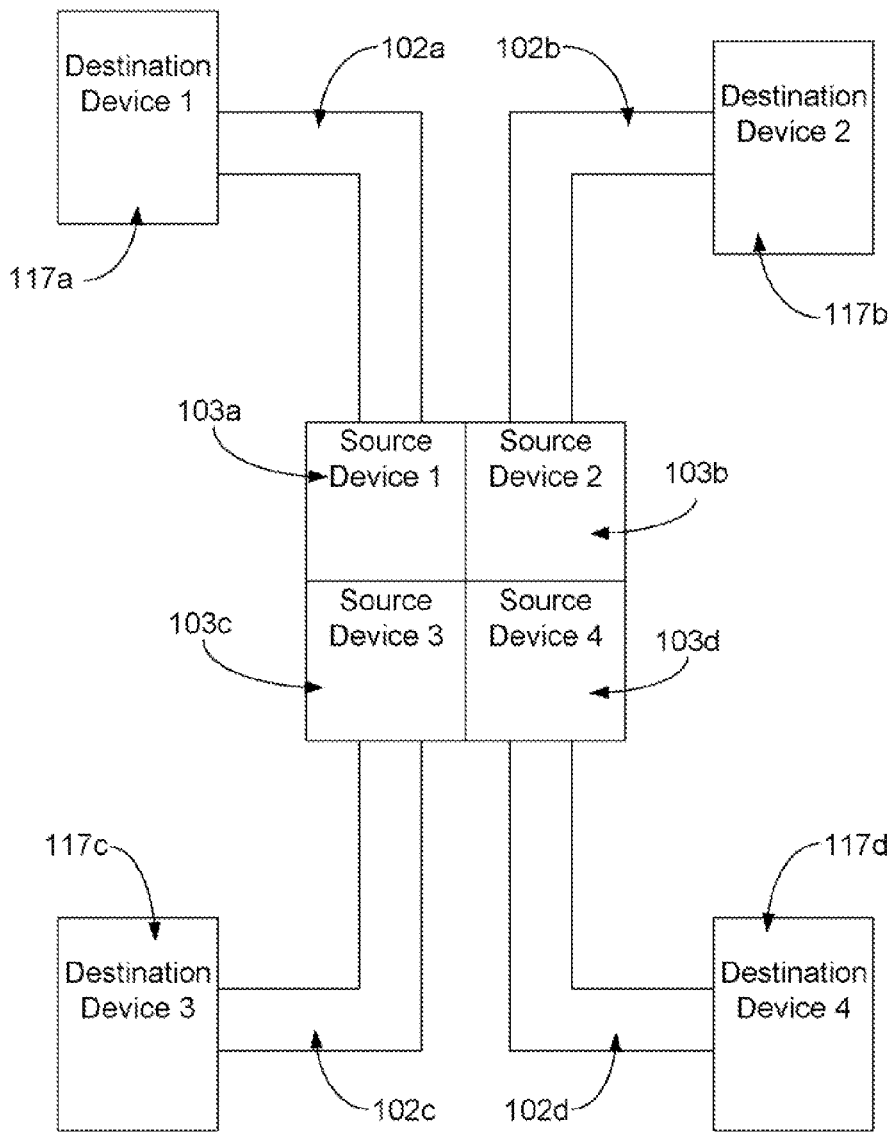
FIG. 14 is a schematic diagram of a system in which multiple source devices form a central device that monitors multiple wires in a room, according to an illustrative embodiment of an aspect of the invention.

FIG. 14 is a schematic diagram of a system in which multiple source devices 103*a-d* form a central device that monitors multiple wires 102*a-d* in a room, according to an illustrative embodiment of the invention. As desired, each source device 103 may contain an ASD 100. Alternatively, more than one source device 103*a-d* may be assembled into a single device that is capable of monitoring multiple branches of wires 102*a-d* extending from the combined device. As desired, each of the wire branches 102*a-d* may be terminated at a destination device 117*a-d* or a load. For example, the combined source device 103*a-d* may be placed in, on, or near one wall of a room and separate wire branches 102*a-d* may extend from the combined source device to each wall of the room. The individual ASDs within the combined source device may then monitor one or more of the wire branches 102*a-d* extending from the combined device.

Figure 15:
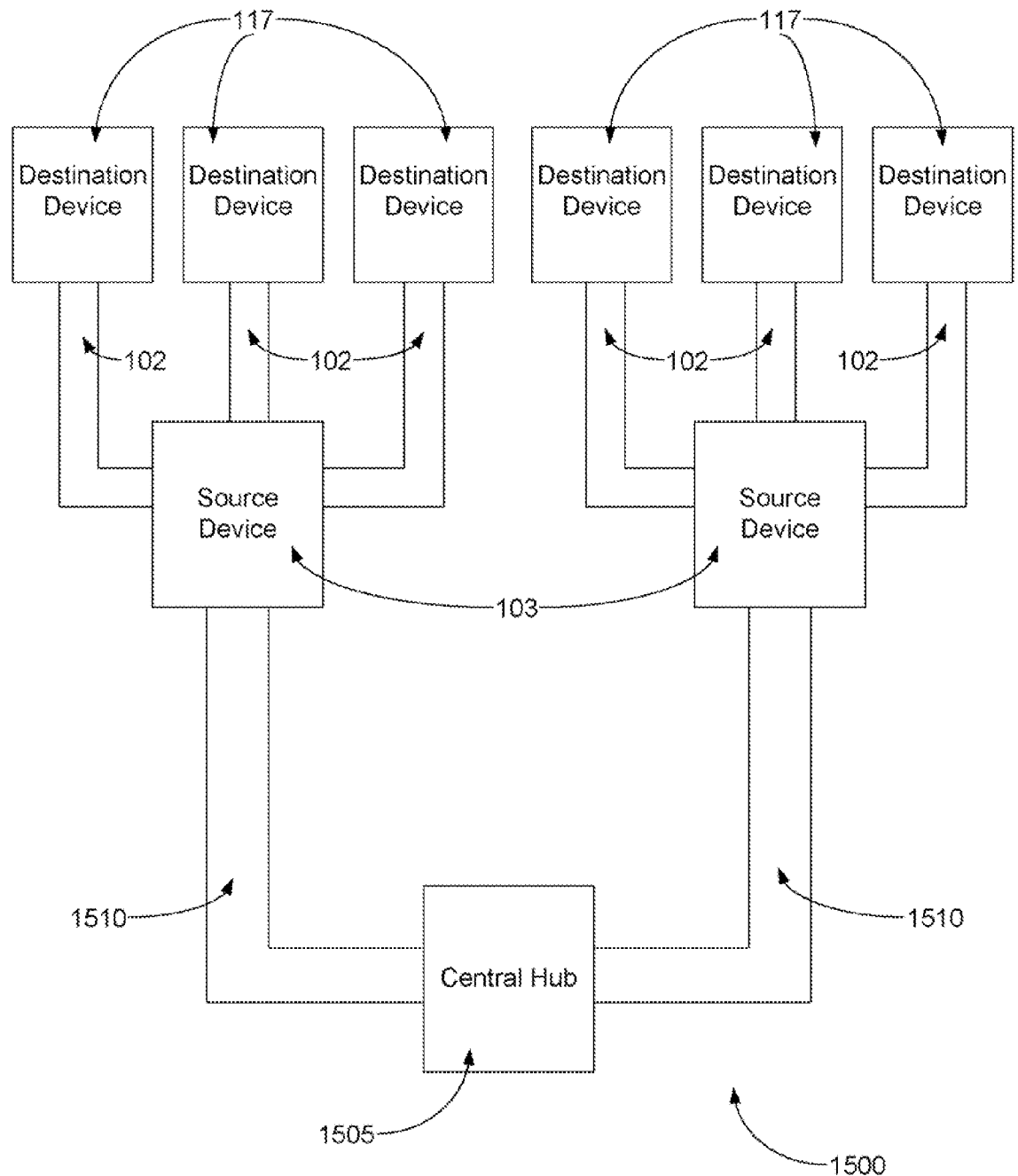
FIG. 15 is a schematic diagram of a network of source devices monitored by a central hub, according to an illustrative embodiment of one aspect of the invention.

FIG. 15 is a schematic diagram of a wire network 1500 that includes a network of source devices 103 monitored by a central hub 1505, according to an illustrative embodiment of the invention. Each of the source devices 103 may include one or more ASDs 100 capable of monitoring wire branches 102 connected to the source devices 103. A network may be established in which one or more electrical wires 1510 are connected between the central hub 1505, which may be associated with a common circuit breaker box, to each room in a building. Each of these electrical wires 1510 may be connected to a source device 103 in a separate room. Accordingly, each source device 103 may be used as a power center that services an entire room.

As desired, each source device 103 may act as a power center that services a room by providing a gateway between the electrical wire 1510 and the wire 102 branch circuits within the room. Each of the wire 102 branch circuits may be connected to one or more destination devices 117, as previously described. Each of the source devices 103 shown in FIG. 1S may contain a single ASD 100 capable of monitoring one or more wire 102 branch circuits or, alternatively, each of the source devices 117 may contain more than one ASD 100 for monitoring wire 102 branch circuits.

Within a room, each source device 103 may service any of the walls, ceiling, and floor with a wire 102 branch circuit. Each source device 103 may individually control the wire 102 branch circuits to which it is connected. Additionally, each source device 103 may communicate with branch circuit destination devices 117 over the wire 102 in order to monitor circuit safety and electrification status. As previously discussed, the destination devices 117 may include a relay, detection circuitry, and/or a control unit that is in communication with the source device 103 monitoring the wire branch circuit 102 to which the destination device 117 is connected. Accordingly, any segment of the wire network may be isolated and shut off if a flaw is detected in that segment.

Each source device 103 also may communicate with the central hub 1505. In certain embodiments, the central hub may be located near the circuit breaker box or at least in the building. It also is possible for the central hub 1505 to be situated remotely from the building. The central hub 1505 may collect data from each of the source devices 103 and provide safety and electrification status for all of the wire branch circuits 102 in the building.

If a wire fault, miswire, or unsafe condition is detected on any given branch circuit, then either the central hub 1505 or the source device 103 controlling that branch circuit, or both, may render that branch circuit unusable and isolate it from the other branches. Alternatively, a downstream destination device 117 connected to a source device 103 may render the miswired or faulty branch circuit unusable and isolate it from the other branches. In other words, that branch circuit may not be permitted to be electrified. In this manner, a miswired or faulty branch circuit may be rendered unusable while at least a portion of the other branch circuits are not affected. Therefore, a penetration of a wire 102 or a miswire of the conductors of a wire 102 may only result in power loss in one branch of the wire network 1500.

Additionally, as desired in certain embodiments of the invention, the wire 102 may be used to communicate signals. These signals may be communicated between any device in a wire network or wire branch circuit over the wire 102. For example, a signal may be communicated between an ASD 100 in a source device 103 over the wire 102 to a destination device. In this regard, local area communications networks may be provided utilizing the wires and/or branch circuits within a structure.

As desired, a communications signal may be transmitted over any of the conductors of the wire 102. A separate communications signal may be transmitted over each of the individual conductors of the wire 102. A signal may be communicated onto one or more of the conductors of the wire 102 by a suitable excitation circuit. For example, a signal may be communicated onto a ground conductor of the wire 102. The signal may then be identified and read from the one or more conductors of the wire 102 by a sense circuit associated with a destination device. In certain embodiments, a communications signal may be a low voltage signal in the range of approximately 0.1 and approximately 5.0 volts. Additionally, a wide variety of frequencies may be utilized for communications signals, such as a frequency at or above approximately 1000 Hz. As another example, a communications signal may be transmitted over the electrifiable conductor of a wire using suitable power line carrier (PLC) or broadband over power line (BPL) technology. A PLC or BPL signal transmitted over the electrifiable conductor may be at a voltage of approximately 0.1 to 20 volts. In one embodiment, the voltage of the signal transmitted over the electrifiable conductor may be at a voltage of approximately 0.1 to 5 volts. Additionally, a PLC or BPL signal transmitted over the electrifiable conductor 205 may be at a frequency that is greater than approximately one megahertz (MHz). For example, the frequency may be in a range of approximately 2 to 20 MHz, although frequencies up to and greater than approximately 40 MHz may be used in conjunction with certain embodiments of the invention. Additionally, as discussed above, a signal may include an appropriate identifier.

As desired, communications signals transmitted over one or more of the conductors of a wire 102 may be used to establish communication between devices that are connected by a wire 102. For example, communications signals may be used to establish communication between two ASDs 100, between an ASD 100 and a destination device 117, or between an ASD 100 and a central hub 1505. Additionally, communication signals may be transmitted over the wire 102 by devices that are connected by the wire 102 according to a communications protocol. For example, the communications signals may be transmitted via a user datagram protocol (UDP), via a transmission control protocol (TCP), or via another suitable protocol as desired. Additionally, a communications signal may be used to establish a connection between two devices connected by a wire 102. The connection established may be a point-to-point connection or it may be some other type of connection, such as a peer-to-peer or local area network connection.

Accordingly, example embodiments of the invention can provide the technical effects of creating a system, method, and apparatus that facilitates the monitoring of electrical wire for wire faults, miswires, and/or abnormal conditions. Example embodiments of the invention may further control the electrification of the electrical wire based upon the monitoring. The electrical wire may be monitored prior to electrification, during electrification, and/or after electrification.

The invention is described above with reference to block and flow diagrams of systems, methods, apparatuses, and/or computer program products according to example embodiments of the invention. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented, or may not necessarily need to be performed at all, according to some embodiments of the invention.

These computer-executable program instructions may be loaded onto a general purpose computer, a special-purpose computer, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, embodiments of the invention may provide for a computer program product, comprising a computer usable medium having a computer readable program code or program instructions embodied therein, said computer readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, can be implemented by special-purpose, hardware-based computer systems that perform the specified functions, elements or steps, or combinations of special purpose hardware and computer instructions.

Many modifications and other embodiments of the invention set forth herein will come to mind to one skilled in the art to which embodiments of the invention pertain having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An electrical safety device comprising:
    at least one current sensing device configured to measure a current on at least one conductor of an electrical wire connected to a load side of the safety device;
    at least one voltage sensing device configured to measure a voltage associated with the safety device; and
    at least one processing component configured to (i) receive the current measurement and the voltage measurement, (ii) identify, based upon the current measurement, an overcurrent event, (iii) after identifying the overcurrent event, compare the voltage measurement to a stored voltage value, (iv) determine, based upon the comparison, a difference between the voltage measurement and the stored voltage value, and (v) when the difference satisfies a threshold condition, direct at least one relay to be opened to discontinue provision of an electrical power signal onto the electrical wire.

2. The safety device of claim 1, wherein the at least one current sensing device comprises one of (i) a current transformer, (ii) a Hall effect device, or (iii) a device that detects voltage differentials over a series of resistors.

3. The safety device of claim 1, wherein the measured current comprises one of (i) a current on an electrifiable conductor of the electrical wire or (ii) a current differential between the electrifiable conductor and a return conductor of the electrical wire.

4. The safety device of claim 1, wherein the at least one voltage sensing device is configured to measure a voltage on a line side of the safety device.

5. The safety device of claim 1, wherein the voltage measurement comprises a plurality of measurements taken within a half cycle associated with the electrical power signal.

6. The safety device of claim 5, wherein:
    the half cycle comprises a first half cycle,
    the plurality of measurements comprise a first plurality of measurements, and the stored voltage value comprises a second plurality of measurements taken within a second half cycle associated with the electrical power signal, the second half cycle preceding the first half cycle.

7. The safety device of claim 6, wherein the at least one processing component is configured to determine whether the difference satisfies the threshold condition by:
    comparing at least a portion of the first plurality of measurements to a corresponding at least a portion of the second plurality of measurements; and
    determining that a plurality of respective differences between a predetermined number of the first plurality of measurements and a corresponding number of the second plurality of measurements satisfy the threshold condition.

8. The safety device of claim 1, wherein the at least one processing component is further configured to replace the stored voltage value with the received voltage measurement.

9. The safety device of claim 1, wherein the at least one processing component is configured to identify the overcurrent event by:
  comparing the received current measurement to a threshold current value; and
  determining that the received current measurement exceeds the threshold current value.

10. The safety device of claim 1, wherein the at least one relay is opened within two half cycles of the electrical power signal.

11. The safety device of claim 1, wherein the at least one relay is opened prior to an amount of energy emitted by a wire fault exceeding a predefined energy threshold.

12. The safety device of claim 1, wherein the at least one processing component is further configured to (i) direct, subsequent to the opening of the at least one relay, communication of a test signal onto at least one conductor of the electrical wire, (ii) monitor, subsequent to communication of the test signal, a current associated with at least one conductor of the electrical wire, and (iii) determine, based at least in part on the monitoring, whether a wire fault is present on the electrical wire.

13. The safety device of claim 1, wherein:
  the at least one current sensing device is configured to measure the current on a grounding conductor of the electrical wire; and
  the at least one processing component is further configured to identify, based upon the current on the grounding conductor, a ground fault associated with the electrical wire.

14. The safety device of claim 1, wherein:
  the at least one voltage sensing device is configured to measure one or more voltages associated with one or more conductors connected to a line side of the safety device; and
  the at least one processor is further configured to determine, based at least in part on the one or more measured voltages, whether the one or more conductors are properly terminated at the safety device.

15. The safety device of claim 1, further comprising at least one electrical outlet.

16. An electrical safety device comprising:
  a line side interface configured to connect to a line side power source and receive an electrical power signal from the line side power source;
  a load side interface configured to connect to an electrical wire;
  at least one relay configured to control the communication of the electrical power signal onto the electrical wire; and
  at least one processing component configured to (i) identify, based at least in part on a current measured on at least one conductor of the electrical wire, an overcurrent event, (ii) initiate, based upon the identification, an in-rush current timer, (iii) after identifying the overcurrent event, compare a measured voltage value to a stored voltage value, (iv) determine, based upon the comparison, a difference between the measured voltage value and the stored voltage value and (v) when the difference satisfies a threshold condition, direct the at least one relay to discontinue communication of the electrical power signal onto the electrical wire, or (vi) when the difference does not satisfy the threshold condition, evaluate the in-rush current timer to determine whether to discontinue communication of the electrical power signal onto the electrical wire.

17. The electrical safety device of claim 16, further comprising:
  at least one current sensing device configured to measure the current on the at least one conductor; and
  at least one voltage sensing device configured to measure the voltage value.

18. The electrical safety device of claim 16, wherein the measured current comprises one of (i) a current on an electrifiable conductor of the electrical wire or (ii) a current differential between the electrifiable conductor and a return conductor of the electrical wire.

19. The electrical safety device of claim 16, wherein:
  the measured voltage value comprises a first plurality of measurements taken within a first half cycle associated with the electrical power signal, and
  the stored voltage value comprises a second plurality of measurements taken within a second half cycle, the second half cycle preceding the first half cycle.

20. The electrical safety device of claim 16, wherein the overcurrent event is identified based upon a determination that the measured current exceeds a threshold current value.

21. The electrical safety device of claim 16, wherein the at least one processor is configured to evaluate the in-rush current timer by:
  determining whether the identified overcurrent event is cleared prior to a value of the in-rush current timer satisfying a threshold timer value; and
  directing, if it is determined that the identified overcurrent event is not cleared, the at least one relay to discontinue communication of the electrical power signal onto the electrical wire; otherwise
  permitting continued communication of the electrical power signal onto the electrical wire.

22. A method for monitoring an electrical wire, the method comprising:
  measuring, by an electrical safety device that facilitates receipt of an electrical power signal from a line side power source and communication of the electrical power signal onto an electrical wire connected to a load side of the electrical safety device, a current on at least one conductor of the electrical wire and a voltage associated with the electrical power signal;
  identifying, by the electrical safety device based at least in part on the current measurement, an overcurrent event;
  after identifying the overcurrent event, comparing, by the electrical safety device, the voltage measurement to a stored voltage value;
  determining, by the electrical safety device based at least in part upon the comparison, a difference between the voltage measurement and the stored voltage value; and
  when the difference satisfies a threshold condition, discontinuing, by the electrical safety device based at least in part upon the determination, communication of the electrical power signal onto the electrical wire.

23. The method of claim 22, wherein measuring the current on at least one conductor of the electrical wire comprises measuring at least one of (i) a current on an electrifiable conductor of the electrical wire or (ii) a current differential between the electrifiable conductor and a return conductor of the electrical wire.

24. The method of claim 22, wherein:
  measuring the voltage comprises measuring a first plurality of voltages within a half cycle associated with the electrical power signal; and
  comparing the voltage measurement to the stored voltage value comprises comparing the first plurality of voltages to a stored second plurality of voltages associated with a second half cycle associated with the electrical power signal, the second half cycle preceding the first half cycle.

25. The method of claim 22, further comprising:
replacing, by the electrical safety device, the stored voltage value with the voltage measurement.

26. The method of claim 22, wherein identifying the overcurrent event comprises:
comparing the current measurement to a threshold current value; and
determining that the current measurement exceeds the threshold current value.

27. The method of claim 22, wherein discontinuing communication of the electrical power signal comprises discontinuing communication of the electrical power signal prior to an amount of energy released by a wire fault associated with the electrical wire exceeding a predetermined energy threshold.

* * * * *